(12) United States Patent
Verschuuren

(10) Patent No.: US 11,874,599 B2
(45) Date of Patent: Jan. 16, 2024

(54) IMPRINTED METHOD AND PATTERNED LAYER

(71) Applicant: KONINKLIJKE PHILIPS N.V., Eindhoven (NL)

(72) Inventor: Marcus Antonius Verschuuren, Berkel-Enschot (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/640,844

(22) PCT Filed: Jun. 16, 2021

(86) PCT No.: PCT/EP2021/066172
§ 371 (c)(1),
(2) Date: Mar. 7, 2022

(87) PCT Pub. No.: WO2021/259715
PCT Pub. Date: Dec. 30, 2021

(65) Prior Publication Data
US 2023/0119298 A1    Apr. 20, 2023

(30) Foreign Application Priority Data

Jun. 23, 2020  (EP) .................... 20181625

(51) Int. Cl.
*G03F 7/00* (2006.01)
*G03F 1/68* (2012.01)
(Continued)

(52) U.S. Cl.
CPC ........... *G03F 7/0002* (2013.01); *G03F 1/68* (2013.01); *G03F 7/0005* (2013.01); *B82Y 30/00* (2013.01); *B82Y 40/00* (2013.01)

(58) Field of Classification Search
CPC . G03F 7/00; G03F 7/0002; G03F 1/00; B82Y 30/00; B82Y 40/00
See application file for complete search history.

(56) References Cited

U.S. PATENT DOCUMENTS 7,749,422 B2   7/2010  Allen et al.
2007/0212494 A1   9/2007  Xu et al.
(Continued)

FOREIGN PATENT DOCUMENTS

EP    2946762 A1    11/2015
EP    3440509 A1    2/2019
(Continued)

OTHER PUBLICATIONS

WO 2020090346 A1 English translation (Year: 2020).*
International Search Report and Written Opinion from PCT/EP2021/066172.

*Primary Examiner* — S. Behrooz Ghorishi
*Assistant Examiner* — John W Hatch

(57) ABSTRACT

Provided is a method of providing a patterned layer (50). The method comprises providing (2, 3A, 3B) a substrate (10) having a surface (11) to which a compound is applied. The compound has at least one condensable group which is reactive with surface groups on the surface of the substrate by condensation reaction. The compound also has a basic group for accepting protons. A layer of a polycondensable imprinting composition (30) is applied (4) onto the layer of the compound. The imprinting composition layer is imprinted (5A, 5B, 5C) with a patterned stamp. During the imprinting, polycondensation of the imprinting composition leads to forming of the patterned layer. Further provided is the patterned layer itself, as well as an optical element and an etch mask, each of which comprises the patterned layer.

13 Claims, 4 Drawing Sheets

(51) Int. Cl.
*B82Y 30/00* (2011.01)
*B82Y 40/00* (2011.01)

(56) References Cited

U.S. PATENT DOCUMENTS

| | | |
|---|---|---|
| 2009/0085255 A1 | 4/2009 | Tada et al. |
| 2011/0146568 A1 | 6/2011 | Haukka et al. |
| 2013/0270741 A1* | 10/2013 | Ookawa ................ B29C 59/005 |
| | | 264/293 |
| 2015/0291815 A1* | 10/2015 | Verschuuren .......... B82Y 40/00 |
| | | 106/31.13 |
| 2016/0015864 A1* | 1/2016 | Yamashita .............. A61L 29/08 |
| | | 604/509 |
| 2016/0144555 A1* | 5/2016 | Honma .................... C08F 2/50 |
| | | 522/182 |
| 2018/0178416 A1 | 6/2018 | Richez et al. |
| 2018/0294167 A1 | 10/2018 | Briston et al. |
| 2018/0305567 A1* | 10/2018 | Verschuuren .......... C09D 11/00 |

FOREIGN PATENT DOCUMENTS

| | | |
|---|---|---|
| EP | 3582004 A1 | 12/2019 |
| WO | 02097533 A1 | 12/2002 |
| WO | 2017174755 A1 | 10/2017 |
| WO | WO-2020090346 A1 * | 5/2020 |

\* cited by examiner

IMPRINTED METHOD AND PATTERNED LAYER

CROSS REFERENCE TO RELATED APPLICATIONS

This application is a U.S. national phase application of International Application No. PCT/EP2021/066172 filed on Jun. 16, 2021, which claims the benefit of EP Application Serial No. 20181625.3 filed on Jun. 23, 2020 and are incorporated herein by reference.

FIELD OF THE INVENTION

The present invention relates to a method of forming a patterned layer.

The present invention further relates to a patterned layer.

The present invention yet further relates to an optical element comprising the patterned layer, and an etch mask comprising the patterned layer.

BACKGROUND OF THE INVENTION

Substrate Conformal Imprint Lithography (SCIL), in common with other imprint lithography techniques, involves imprinting a layer which has been applied to the surface of a substrate with a patterned stamp. The stamp may, for instance, be made from silicone rubber, such as polydimethylsiloxane (PDMS). The layer may be hardened or cured during imprinting with the stamp. When sufficient curing has occurred, the stamp is removed leaving a patterned layer on the substrate.

Various types of imprinting compositions may be used, such as UV-curable and sol-gel compositions. The suitability of a curable compound for use in an imprintable medium is governed by its etch characteristics or persistent functional properties (such as optical) after formation of the pattern on a carrier, such as a semiconductor substrate. For this reason, compositions based on inorganic sol and sol-gel materials, such as alkoxysilane-derived sols and sol-gels, have proven popular because of their excellent etching resistance and selectivity, excellent adhesiveness and good mechanical and optical properties when condensated into polysiloxane networks. Moreover, such compositions may be used to produce patterned layers with features having dimensions ranging from less than ten nanometers to hundreds of nanometers and to around 10 microns.

In such compositions, a sol (or solution) is initially formed, e.g. by hydrolysis of an inorganic hydroxide and/or alkoxide. The sol may comprise oligomeric or linear polymeric species formed by condensation processes, during which water and/or alcohol may be released. During the manufacture of the imprint composition, or during imprinting, the sol reacts to form a sol-gel by further condensation processes which afford a three-dimensional network. Removal of solvents from the network, including the water and/or alcohol, e.g. by evaporation, results in formation of the (hardened) inorganic oxide. The sol formed from hydrolysis and polycondensation of such small molecule or oligomeric hydroxide or alkoxide precursors may in some cases be regarded as a colloid. The term "colloid" may refer to a solid-liquid and/or a liquid-liquid mixture in which solid or liquid particles are dispersed in a liquid medium.

An alternative wet-chemical route is to use nanoparticle dispersions, such as transition metal oxide nanoparticle dispersions, instead of molecular precursors. Such nanoparticles are usually stabilised by a positive charge on the particle in a dispersion or sol with a pH of between 0 and 1. In these systems the nanoparticles also form a three-dimensional network by polycondensation reactions between the reactive chemical groups on the surface of the transition metal oxide particles, e.g. —OH, —COOH, —NH$_2$; —SH groups or the like, which are the remnants of the synthesis routes for such transition metal oxide nanoparticles.

For both sol-gel and nanoparticle solutions/dispersion-based imprinting compositions, the condensation polymerization (polycondensation) reactions are typically reversible reactions, which are shifted to the polycondensation side of the equilibrium during imprinting of the composition with a permeable stamp. This is due to some of the reaction products, e.g. water or alcohol, which are released upon formation of the condensation product, being transported away from the reaction site by diffusion into/through the stamp material, as well as by evaporation, thereby disfavouring the reverse (hydrolysis or alcoholysis) reaction.

However, application of such polycondensable imprinting compositions in imprint lithography is not always straightforward. An important requirement is that the imprinting process must be reproducible in order for the process to be widely applicable on a large scale. For instance, the imprinting composition must have an appropriate viscosity to allow facile deposition on a target substrate, and a suitable viscosity must be maintained until the imprinting composition has been imprinted with the stamp, i.e. the polycondensable imprinting composition must be pliable enough for it to mold to the feature pattern on the stamp surface.

Depending on the conditions, the imprint time, defined as the time during which the stamp is in contact with the imprinting composition from a liquid to a cured/solid gel layer which permits removal of the stamp without damaging the pattern, may vary from a few seconds to more than 12 hours. Various factors may influence the imprinting time, such as degree of condensation in the sol, the water content in the composition, the presence of co-solvents, the ambient conditions, e.g. relative humidity during coating of the composition onto a substrate, the temperature during imprinting, the surface chemistry of the underlying material to be imprinted on, the critical time from application of the sol-gel layer (e.g. by spincoating, inkjetting, spraycoating etc.) until the stamp is applied to the layer, and the pH of the composition (Marc A. Verschuuren, Substrate Conformal Imprint lithography for Nanophotonics, 2010, University Utrecht, The Netherlands).

US 2018/178416 A1 discloses an imprinting apparatus including a silicon master having a plurality of nanofeatures defined therein.

EP 3 582 004 A1 discloses a sol-gel imprinting ink composition comprising a sol and an additive for promoting gelation of the composition.

EP 3 440 509 A1 discloses an imprint lithography stamp, and a method of making and using the stamp.

US 2007/212494 A1 discloses a method for imprint lithography utilizing an adhesion primer layer.

US 2009/085255 A1 discloses a photo nanoimprint lithography method.

SUMMARY OF THE INVENTION

The invention is defined by the claims.

According to an aspect, there is provided a method of providing a patterned layer, the method comprising: providing a substrate comprising a surface to which a layer of a compound is applied, wherein the compound comprises at least one condensable group reactive with surface groups of the surface by condensation reaction, and a basic group for accepting protons; applying a layer of a polycondensable imprinting composition onto the layer of the compound; and imprinting the imprinting composition layer with a patterned stamp, polycondensation of the imprinting composition taking place during the imprinting thereby to form the patterned layer.

The present invention is based on the realisation that applying a layer of a compound having a basic group to the surface of the substrate prior to application of the polycondensable imprinting composition may assist to improve the predictability of the polycondensation reaction of the imprinting composition, and, in particular, lessen the risk that acidic sites on the surface of the substrate unduly retard the rate of gelation of the imprinting composition during imprinting with the patterned stamp. In other words, the layer of the compound may serve to decouple the surface chemistry of the substrate, and in particular the acidity or basicity of the surface, from the polycondensation chemistry of the imprinting composition.

The timing of application of the layer of the compound to the surface with respect to the subsequent application of the polycondensable imprinting composition to the layer of the compound has not been found to be particularly restrictive. For example, the polycondensable imprinting layer has been layered onto the layer of the compound within around 30 seconds of the layer of the compound having been applied. In other tests, the polycondensable imprinting composition has been applied to the layer of the compound within a few minutes, or 16 to 24 hours, from application of the layer of the compound to the surface with similar results.

The basic groups, in other words Brønsted base groups, of the compound may assist to neutralise acidic sites on the surface of the substrate. Neutralisation of the acidic sites via the layer of the compound may thus enable an imprinted layer to be formed within a shorter imprinting time than, for example, the scenario in which there is no layer of the compound on the surface of the substrate prior to the polycondensable imprinting composition layer being applied thereto. Moreover, the basic groups of the layer of the compound may provide additional basic sites to increase the pH, e.g. basify, the polycondensable imprinting layer to achieve faster polycondensation/curing behaviour.

The imprinting time is defined as the time during which the stamp is in contact with the imprinting composition from a liquid to a cured gel layer which permits removal of the stamp without damaging the pattern.

The layer of the compound is preferably grafted to the surface of the substrate prior to application of the layer of the polycondensable imprinting composition. This grafting is achieved via the condensation reaction between the surface groups of the surface and the condensable group(s) of the compound.

The surface groups may be, for example, surface hydroxyl groups and/or surface carboxyl groups.

The substrate may, for instance, comprise at least one of a metal layer, a metalloid layer, a glass layer, and a polymer layer.

When the substrate comprises a glass layer, the glass may comprise or consist of boro-silicate, alumino-silicate, and/or lanthanide-based glass. In such examples, the surface of the glass layer may comprise surface hydroxyl groups. Such surface hydroxyl groups are included in or define the surface groups which react with the condensable group of the compound.

When the substrate comprises a polymer layer, the polymer may comprise or consist of cyclic olefin copolymer (COC), poly(methyl methacrylate) (PMMA), and/or polycarbonate (PC). Other suitable polymers can also be considered.

In such examples, the surface of the polymer layer may comprise hydroxyl and/or carboxyl groups. Such surface hydroxyl and/or carboxyl groups are included in or define the surface groups which react with the condensable group of the compound.

The surface of the polymer layer may be chemically altered, e.g. via an ozone or plasma treatment, in order for such surface groups to be provided at the surface of the polymer layer.

In examples in which the substrate comprises a metal or metalloid layer, an oxide layer may be disposed on the metal or metalloid layer. In such examples, the surface groups include hydroxyl groups at the surface of the oxide layer.

The substrate may, for example, comprise a chromium layer with a chromium oxide layer, e.g. a naturally-formed chromium oxide layer, disposed thereon, the hydroxyl groups being included in the surface of the chromium oxide layer. In an alternative non-limiting example, the substrate comprises an aluminium layer with an aluminium oxide layer disposed thereon, the hydroxyl groups being included in the surface of the aluminium oxide layer. The acidic sites of aluminium and chromium oxide layers may present particular difficulty in terms of forming the patterned layer thereon using a polycondensable imprinting composition. But by applying the layer of the compound to such surfaces prior to applying the polycondensable imprinting composition, inhibition of polycondensation of the latter by such acidic sites may be alleviated, such as to achieve shorter imprinting times in spite of the acidic sites on the surface of such substrates.

The substrate may comprise a silicon layer or a gallium arsenide layer. In the case of the silicon layer, a silicon oxide layer or an aluminium oxide layer may be disposed on the silicon layer. The hydroxyl groups may be included in the surface of the silicon oxide or aluminium oxide layer. In the case of the gallium arsenide layer, an arsenic oxide layer may be disposed on the gallium arsenide; the hydroxyl groups being included in the surface of the arsenic oxide layer. Gallium arsenide layers also present difficulty in terms of forming the patterned layer, which is thought to be due to arsenic acid, $H_3AsO_4$, at or close to the surface of the layer disrupting the polycondensation of the imprinting composition. The layer of the compound assists to alleviate the influence of arsenic acid in this example, by the basic groups serving to accept the acidic protons. In this way, shorter imprinting times may be observed in spite of the inherent acidity associated with the gallium arsenide surface layer of the substrate.

The layer of the compound may have a thickness of less than 10 nm, and preferably less than 5 nm. For example, the layer of the compound may have a thickness between 1 nm and 5 nm. This thickness of the layer of the compound may assist in terms of providing proton binding sites to compensate for the acid generating groups of the substrate. Moreover, the basic groups of the layer of the compound may, in certain examples, provide additional basic sites to increase the pH of the polycondensable imprinting layer, e.g. to achieve faster polycondensation/curing behaviour. Such a relatively thin layer may also assist to minimise the influence of the grafted layer on the transfer of imprinted patterns to the imprinting layer atop the layer of the compound.

The layer of the polycondensable imprinting composition may, for example, have a thickness of 20 nm to 1 μm.

The grafted layer preferably is not patterned by the patterned stamp, but rather defines a non-imprinted subjacent layer with respect to the patterned layer.

The basic group of the compound may comprise an amine group. The amine group may be a primary, secondary or tertiary amine group. Preferably, the basic group is a primary amine group, —$NH_2$.

The at least one condensable group may comprise an alkoxy silyl group, the compound being thereby grafted to the surface via oxygen-silicon bonds. Moreover, chemical bonding to the imprinting composition layer through condensation to the substrate surface or the applied layer of the compound may be provided via free reactive groups, e.g. via more than one condensable group per molecule of the compound.

The condensable group preferably comprises two or three alkoxy groups bonded to the same silicon of the alkoxy silyl group. In this example, the compound may be grafted to the surface of the substrate via a silicon atom which may also be subsequently grafted, via a further condensation reaction, to the polycondensable imprinting composition.

The compound may comprise a linker moiety, the linker moiety linking, in other words covalently bonding, the at least one condensable group with the basic group. The linker moiety may be, for example, an alkyl or ether chain, e.g. an alkyl or ether chain having 1 to 20 carbon atoms.

The compound may be one or more selected from 3-Aminopropyltrimethoxysilane, 3-Aminopropyltriethoxysilane, N-Methyl (trimethoxysilyl)propylamine, N-Methyl-3-(triethoxysilyl)propylamine, N-[3-(Trimethoxysilyl)propyl]butan-1-amine, N-[3-(Triethoxysilyl)propyl]butan-1-amine, [3-(6-Aminohexylamino)propyl]trimethoxysilane, [3-(6-Aminohexylamino)propyl]triethoxysilane, N-(2-Aminoethyl)-3-aminopropyltrimethoxysilane, N-(2-Aminoethyl)aminopropyltriethoxysilane, N,N-Dimethyl-3-(trimethoxysilyl)propylamine, N,N-Dimethyl-3-(triethoxysilyl)propylamine, N,N-Diethyl-3-(trimethoxysilyl)propylamine, N,N-Diethyl-3-(triethoxysilyl)propylamine, Bis[3-(trimethoxysilyl)propyl]amine, Bis[3-(triethoxysilyl)propyl]amine, 5,5'-Bis(triisopropoxysilyl)-2,2'-bipyridine, 5,5'-Bis(trimethoxysilyl)-2,2'-bipyridine, 5,5'-Bis(triethoxysilyl)-2,2'-bipyridine, N,N-Bis[(diphenylphosphino)methyl]-3-(trimethoxysilyl)propylamine, N,N-Bis[(diphenylphosphino)methyl]-3-(triethoxysilyl)propylamine, N-[3-(Trimethoxysilyl)propyl]aniline, and N-[3-(Triethoxysilyl)propyl]aniline.

The grafting of the layer of the compound to the surface of the substrate may comprise vapour deposition of the compound on the surface. Alternatively, the grafting may comprise applying the compound to the surface as a liquid, for example as a neat liquid, or dissolved and/or dispersed in a solvent. In the latter case, the grafting may comprise, following application of the liquid to the surface, evaporating the solvent.

The polycondensable imprinting composition layer may comprise the hydrolysis product of at least one of a trialkoxysilane and a tetraalkoxysilane. For example, the polycondensable imprinting composition layer comprises the hydrolysis product of the trialkoxysilane and the tetraalkoxysilane, and the molar ratio of the tetraalkoxysilane to the trialkoxysilane is 1:1 to 0.45:0.55. It has been found that when a combination of an alkyl trialkoxysilane and a tetraalkoxysilane in the aforementioned ratio is used, a desirable degree of crosslinking in the gel may ultimately be attained.

The tetraalkoxysilane may, for instance, be selected from tetramethoxyorthosilicate and tetraethoxyorthosilicate, and the trialkoxysilane is selected from methyltrimethoxysilane and methyltriethoxysilane.

Alternatively or additionally, the polycondensable imprinting composition layer may comprise the hydrolysis product of at least one of a titanium alkoxide, a zirconium alkoxide and a hafnium alkoxide. High quality patterned layers may be attained using such metal alkoxide-derived sol-gel systems, in relatively short imprinting times, particularly when the sol is imprinted atop the layer of the compound, e.g. the grafted layer of the compound.

In an embodiment, prior to the applying of the polycondensable imprinting composition layer to the layer of the compound, the sol has a pH of 4-7 when mixed with an equal volume of deionized water and measured at 20° C. and 1 atm.

By adjusting the pH of the polycondensable imprinting composition to this pH, the composition may have appropriate properties, e.g. viscosity, for forming a layer of the composition which is suitable for imprinting. This pH has also been found to extend the shelf-life of the composition, e.g. relative to a composition having a pH, as measured using this method, which is greater than 7.

In a non-limiting example, the polycondensable imprinting composition layer comprises an additive for promoting gelation of the composition during imprinting at an imprinting temperature between 15° C. and 120° C., the additive being the reversible reaction product of a protic acid and a proton-accepting base, wherein the vapour pressure of the acid is higher than that of the base at the imprinting temperature thereby to enable basifying of the composition during the imprinting. This pH adjustment during the imprinting may assist to shorten the curing time, whilst avoiding the shelf life of the polycondensable imprinting composition being compromised prior to its application onto the layer of the compound.

The polycondensable imprinting composition layer may comprise nanoparticles, for example transition metal oxide particles. The nanoparticles may, for example, comprise polycondensable surface groups.

In such a nanoparticle dispersion-based imprinting composition, the pH of the dispersion, i.e. the polycondensable imprinting composition in this case, prior to application on the surface of the substrate may be less than 3 when mixed with an equal volume of deionized water and measured at 20° C. and 1 atm. This may assist to provide controlled polycondensation of the nanoparticle dispersion during imprinting, whilst ensuring that the pH of the dispersion is compatible with the layer of the compound and the substrate.

A surface of the layer of the compound on which the polycondensable imprinting composition layer is applied may have surface groups, such as alkoxy and/or hydroxide groups, reactive with the polycondensable imprinting composition layer by a further condensation reaction. In this embodiment, the applying and/or imprinting further comprises grafting the polycondensable imprinting composition layer to the layer of the compound, which itself may be grafted to the surface, via the further condensation reaction. This may facilitate adhesion of the patterned layer to the substrate via the grafted layer.

The method may further comprise removing the patterned stamp after the imprinting. The patterned layer may, for example, be heated after removal of the patterned stamp. This heating step may, for instance, be implemented at a temperature between 70° C. and 400° C. This additional heating step may implement further hardening and/or densifying of the patterned layer during which further polycondensation reactions may occur and/or volatile components, e.g. alcohol(s) and water, may be evaporated from the patterned layer.

According to another aspect there is provided a kit for use in the above-defined method. The kit comprises a first component comprising the compound, and a second component comprising the polycondensable imprinting composition, wherein the first component and the second component are supplied separately from each other in the kit. Use of the kit may first involve forming the layer of the compound, e.g. the grafted layer, using the first component, and subsequently applying the polycondensable imprinting composition to the layer, and imprinting the composition with a patterned stamp. By keeping the first and second components separate from each other, the basic groups of the compound may be prevented from causing premature polycondensation of the imprinting composition.

In an embodiment, the kit also comprises the substrate.

The first component may, for example, comprise the substrate on which the layer of the compound is (pre-) applied, e.g. grafted. Use of such a kit may thus involve applying the polycondensable imprinting composition to the applied, e.g. grafted, layer of the compound, and imprinting the composition with a patterned stamp.

According to still another aspect there is provided a patterned layer obtainable from the method as defined above.

According to yet another aspect there is provided an assembly obtainable from the method as defined above.

The assembly may comprise the substrate, the layer of the compound having the basic group grafted to the surface of the substrate, and the polycondensed patterned layer, as described above.

The grafted layer and the patterned layer may be compositionally distinct from each other. Alternatively or additionally, the polycondensed patterned layer may have a different, e.g. higher, density in comparison to the grafted layer.

According to still another aspect there is provided an optical element comprising the above-described patterned layer or assembly. The optical element may, for example, be a lens, a light scattering element, arrangements of light scattering elements, a collimator, an in-coupling element, a waveguide, a photonic device such as a ring resonator, a wavelength filter or an amplitude modifier.

According to a further aspect there is provided an etch mask comprising the above-described patterned layer or assembly.

BRIEF DESCRIPTION OF THE DRAWINGS

Embodiments are described in more detail and by way of non-limiting examples with reference to the accompanying drawings, wherein.

DETAILED DESCRIPTION OF THE EMBODIMENTS

Figure 1:
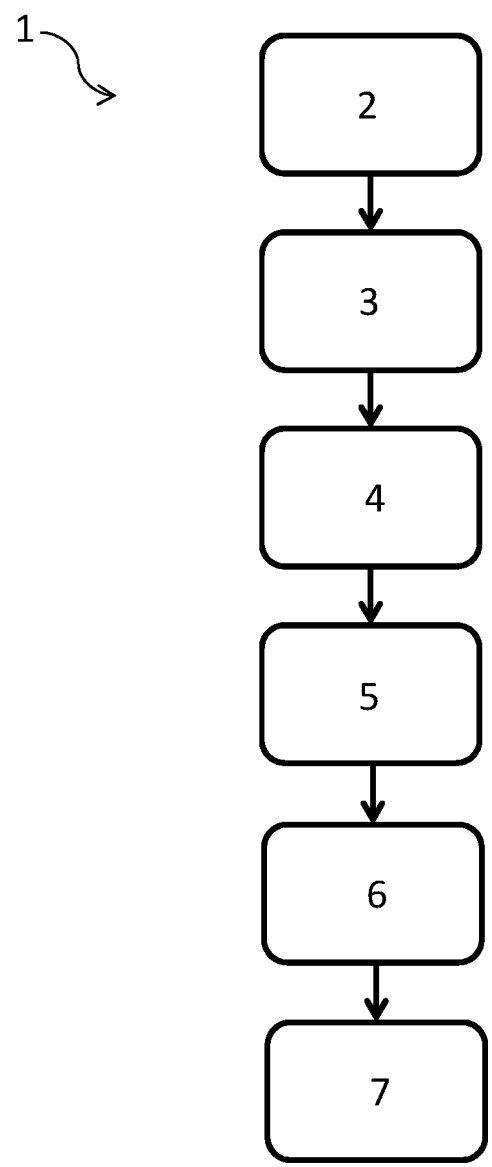
FIG. 1 provides a flowchart of a method according to an example.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts, unless otherwise stated.

The present disclosure relates to forming patterned layers through imprinting techniques such as Substrate Conformal Imprint Lithography (SCIL) in which a stamp having a patterned surface, typically a surface carrying a pattern of features of µm and/or nm dimensions, is brought into contact with an imprinting composition. The features may have dimensions down to 5 nm, although the feature dimensions may typically be 50 nm to 500 nm.

Provided is a method of providing such a patterned layer. The method comprises providing a substrate having a surface to which a compound is applied. The compound has at least one condensable group which is reactive with surface groups on the surface of the substrate by condensation reaction. The compound also has a basic group for accepting protons. A layer of a polycondensable imprinting composition is applied onto the layer of the compound. The imprinting composition layer is imprinted with a patterned stamp. During the imprinting, polycondensation of the imprinting composition leads to forming of the patterned layer. Further provided is a kit for use in the method, and the patterned layer itself, as well as an optical element and an etch mask, each of which comprises the patterned layer.

Polycondensation of the imprinting composition, for example an inorganic crosslinking-based imprint resist, e.g. sol-gel-based and/or nanoparticle dispersion-based resist composition, may progress more slowly under more acidic conditions. It is partly for this reason that such polycondensable imprinting compositions tend to be supplied and/or stored at relatively low pH.

Disfavouring of polycondensation in this way may, however, have disadvantages when it is desired to form the patterned layer. In particular, the presence of acidic sites on the surface of the substrate to which the polycondensable imprinting composition is directly applied may contribute to retarding of polycondensation of the imprinting composition during imprinting. Such an effect has been found to make patterned layer formation prohibitively slow for certain substrates, such as aluminium and chromium substrates, whose oxide surface layers have such acidic sites. Moreover, a polycondensable imprinting composition formulated for a substrate whose surface includes such acidic sites may undergo undesirably rapid polycondensation when stored or applied to a surface having comparatively fewer acidic sites. In the latter case, the properties of the resulting patterned layer, such as density, refractive index, porosity, etc., may be compromised.

One potential solution to these problems would be to apply a silicon oxide or silicon nitride (SiNx) layer onto the surface of the substrate, for example by sputter deposition, low pressure chemical vapour deposition (LP-CVD), or plasma enhanced chemical vapour deposition (PE-CVD) methods. These methods generate a relatively closed layer, which means that any acid generating sites on the surface of the substrate may be rendered inaccessible by the silicon oxide or silicon nitride layer. The problem is that these methods require high vacuum equipment and typically require relatively high temperatures. For example, PE-CVD can require a temperature of >200° C., and LP-CVD can require a temperature of >650° C. Such temperatures may limit the applicability of such techniques to a relatively limited selection of underlying substrate layers and devices, and these methods are costly.

An alternative solution would be to apply a silicon oxide sol-gel layer, in other words using a wet chemical method. After a moderate heating step, for example at a temperature of <200° C., a layer having relatively good adhering properties for a subsequently applied imprinting layer may be formed. The issue is that such intermediate layers are not closed, such that the acid generating sites on the surface of the substrate are still available to modify the chemistry of the subsequently applied imprinting composition.

The present invention is based on the realisation that applying a layer of a compound having a basic group to the surface of the substrate prior to application of the polycondensable imprinting composition may improve the predictability of the polycondensation reaction of the imprinting composition. In particular, the risk that acidic sites on the surface of the substrate unduly retard the rate of polycondensation of the imprinting composition during imprinting with the patterned stamp may be lessened. In other words, the layer of the compound may serve to decouple the surface chemistry of the substrate, and in particular the acidity or basicity of the surface, from the polycondensation chemistry of the imprinting composition.

The basic groups, in other words Brønsted base groups, may assist to neutralise acidic sites on the surface of the substrate. Neutralisation of the acidic sites via the layer of the compound may thus enable an imprinted layer to be formed within a shorter imprinting time than, for example, the scenario in which there is no layer of the compound on the surface of the substrate prior to the polycondensable imprinting composition layer being applied thereto. Moreover, the basic groups of the layer of the compound may provide additional basic sites to increase the pH, e.g. basify, the polycondensable imprinting layer to achieve faster polycondensation/curing behaviour.

Thus, the basic group of the compound may provide a controlled compensation for the acid generating groups which may be present on the surface of the substrate.

Moreover, the compound may be straightforwardly applied at relatively low temperature, preferably below 100° C., to the surface of the substrate.

In an embodiment, the layer of the compound is grafted to the surface of the substrate prior to application of the polycondensable imprinting composition atop the grafted layer. Following grafting of the compound to the surface, the grafted layer may be mainly inorganic in nature, and thus compatible with the polycondensable imprinting composition layer, e.g. the sol-gel or nanoparticle-based imprinting composition layer, which is subsequently applied atop the grafted layer.

Such polycondensable imprinting composition layers typically require annealing temperatures over 200° C. and/or are used as a functional material where stability is required towards heat, moisture and high light, e.g. UV light, fluxes. The grafted layer may not or may only minimally degrade under these conditions. Alternatively, the grafted layer may be allowed to react, but then form a stable inorganic material without absorption and provide good adhesion between the substrate and the patterned layer.

Figure 2A:
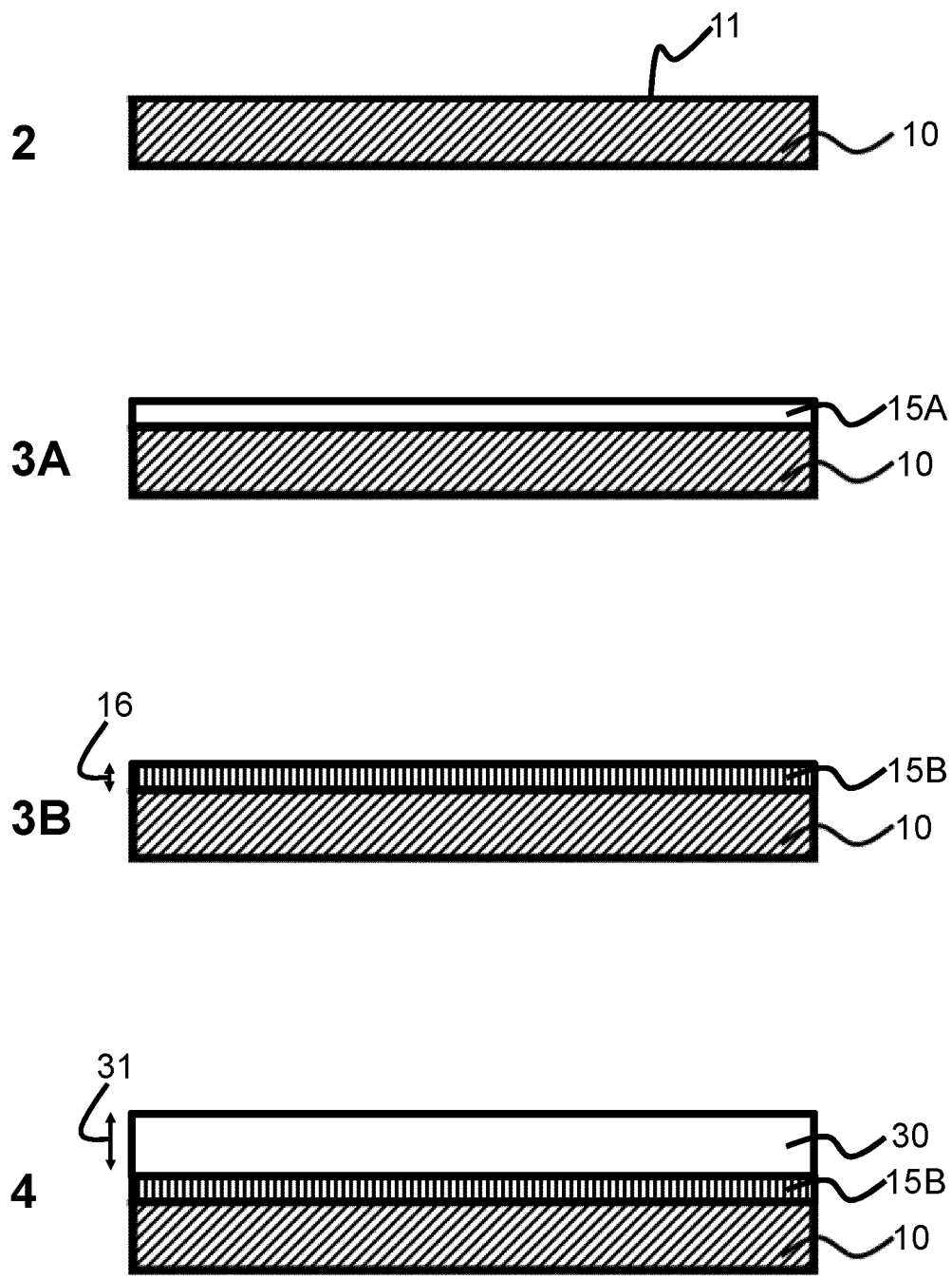
FIG. 2A schematically depicts a first part of a method of forming a patterned layer according to an example.

Referring to FIGS. 1 and 2A, the method 1 comprises providing 2 a substrate 10. The substrate 10 has a surface 11 having surface groups. In an embodiment, the substrate 10 comprises a metal layer, a metalloid layer, a polymer layer, or a glass layer.

The surface groups of the substrate 10 react with the condensable group of the compound. This permits the layer of the compound to be grafted to the surface 11 of the substrate 10.

The surface groups may be, for example, surface hydroxyl groups and/or surface carboxyl groups.

When the substrate 10 comprises a glass layer, the glass may comprise or consist of boro-silicate, alumino-silicate, and/or lanthanide-based glass. In such an example, the surface 11 of the glass layer may comprise surface hydroxyl groups. Such surface hydroxyl groups are included in or define the surface groups which react with the condensable group of the compound.

When the substrate comprises a polymer layer, the polymer may comprise or consist of cyclic olefin copolymer (COC), poly(methyl methacrylate) (PMMA), and/or polycarbonate (PC). Other suitable polymers can also be considered. In such examples, the surface 11 of the polymer layer may comprise hydroxyl and/or carboxyl groups. Such surface hydroxyl and/or carboxyl groups are included in or define the surface groups which react with the condensable group of the compound.

The surface of the polymer layer may be chemically altered, e.g. via an ozone or plasma treatment, in order for such surface groups to be provided at the surface of the polymer layer.

Particularly in the cases of the substrate 10 comprising a metal layer or a metalloid layer, the substrate may further comprise an oxide layer disposed on the metal or metalloid layer. Hydroxyl groups may be included in the surface 11 of the oxide layer.

The term "metal layer" as used herein refers to both a layer formed of a single metal, and a layer formed of a metal alloy, in other words an metal alloy of two or more different elements.

In a non-limiting example, the substrate 10 comprises a chromium layer with a chromium oxide layer disposed thereon. In this example, the hydroxyl groups are included in the surface 11 of the chromium oxide layer.

In another example, the substrate 10 comprises an aluminium layer with an aluminium oxide layer disposed thereon. In this example, the hydroxyl groups are included in the surface 11 of the aluminium oxide layer.

The acidic sites of aluminium and chromium oxide layers may present particular difficulty in terms of forming the patterned layer thereon using a polycondensable imprinting composition. But by applying, e.g. grafting, the layer of the compound to such surfaces prior to applying the polycondensable imprinting composition, inhibition of polycondensation of the latter by such acidic sites may be alleviated, such as to achieve shorter imprinting times in spite of the acidic sites on the surface 11 of such substrates 10.

The term "metalloid layer" as used herein refers to both a layer formed of a single metalloid, such as boron, silicon, germanium, arsenic, antimony, and tellurium, and a layer formed from more than one of these metalloid elements.

In a non-limiting example, the substrate 10 comprises a silicon layer with a silicon oxide layer or an aluminium oxide layer disposed thereon. The hydroxyl groups are thus included in the surface 11 of the silicon oxide or aluminium oxide layer.

In the case of the silicon oxide layer, the silicon oxide layer may be the native oxide layer which forms on the silicon layer.

In the case of the aluminium oxide layer on the silicon layer, this aluminium oxide layer may be formed on the silicon layer in any suitable manner, such as by sputter deposition of the aluminium oxide layer onto the silicon layer.

In another example, the substrate 10 comprises a gallium arsenide layer having an arsenic oxide layer disposed thereon. In this case, the hydroxyl groups are included in the surface 11 of the arsenic oxide layer.

Gallium arsenide layers also present difficulty in terms of forming the patterned layer, which is thought to be due to arsenic acid, $H_3AsO_4$, at or close to the surface 11 of the layer disrupting the polycondensation of the imprinting composition. The layer of the compound assists to alleviate the influence of arsenic acid in this example, by the basic groups serving to accept the acidic protons. In this way, shorter imprinting times may be observed in spite of the inherent acidity associated with the gallium arsenide surface layer of the substrate 10.

Figure 2B:
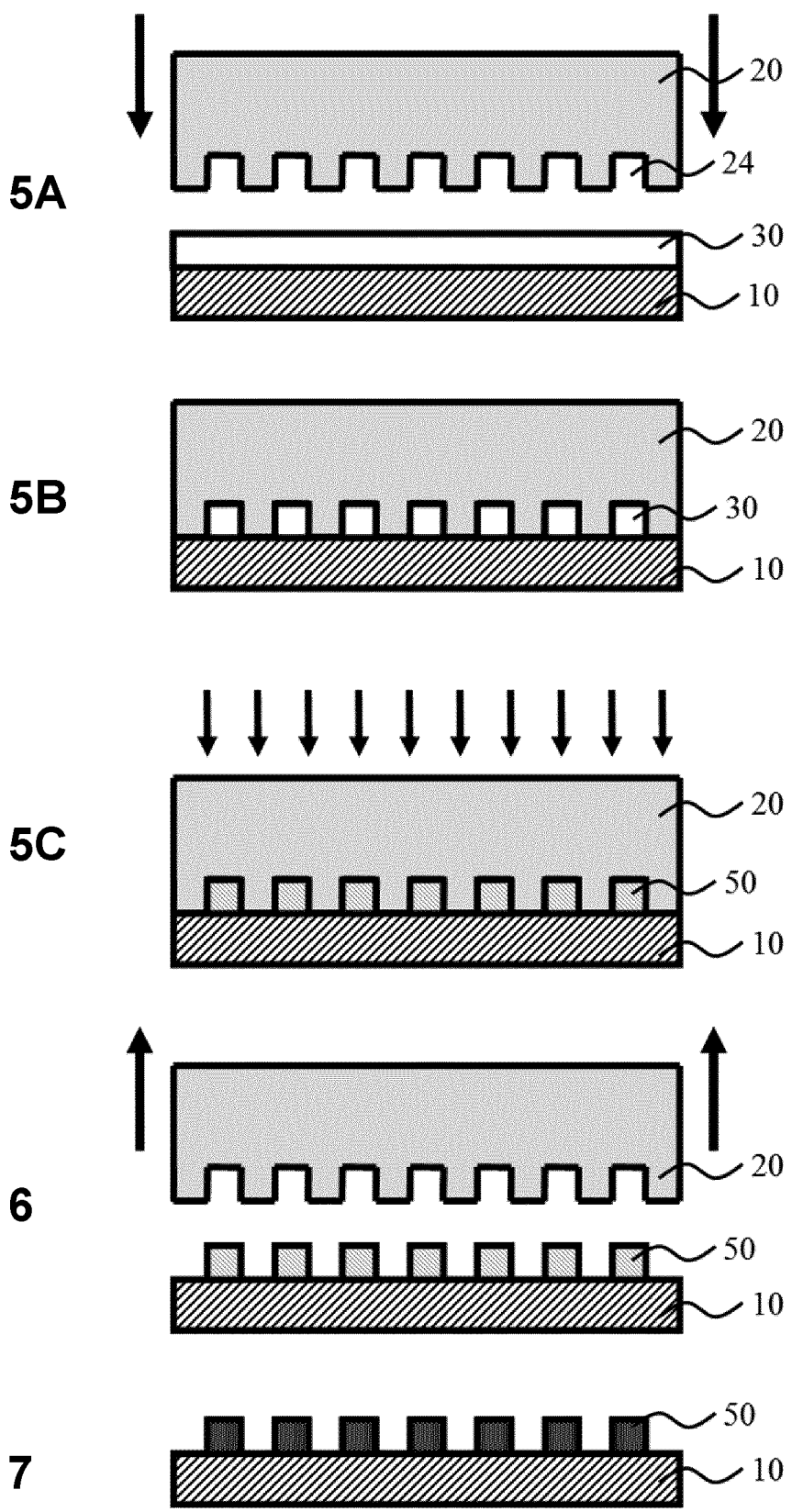
FIG. 2B schematically depicts a second part of the method continuing from the first part of the method shown in FIG. 2A.

Whilst the substrate 10 schematically depicted in FIGS. 2A and 2B has a planar surface 11, this is not intended to be limiting. The surface 11 may be curved and/or contoured, since the elastomeric properties of the patterned stamp may permit transfer of patterns, even with features having relatively small (nm or µm) dimensions, to such a curved and/or contoured surface 11. This imprinting lithography technique furthermore permits patterning of a surface 11 having a relatively large area, e.g. of the order of hundreds of square centimeters.

A compound is provided, the compound comprising one or more condensable groups reactive with the surface groups by condensation reaction, and a basic group for accepting protons. The basic group may be any suitable basic group which can act as a proton acceptor. In particular, the basic group may be capable of reacting with protons present on or close to the surface 11 of the substrate 10.

In an embodiment, the basic group is an amine group, such as a primary, secondary or tertiary amine group. Preferably, the basic group is a primary amine group, —$NH_2$.

At least some of the surface groups, e.g. the surface hydroxyl groups may, for example, be protonated. In other words, the oxygen of such protonated surface hydroxyl groups may carry a positive charge due to being bonded to two protons. The basicity of the basic group may be such that the positively charged hydroxyl group may be deprotonated by the basic group. In this way, the basic group may neutralise acidic sites on the surface 11 of the substrate 10, thereby to assist to minimise the influence of such acidic sites, if present, on polycondensation of the imprinting composition layer, as will be described in more detail herein below.

The basic group may have a basic character which compensates, or even over-compensates for the acidic sites of the substrate 10. The total amount of basic groups per unit area of the substrate may also be influenced by the layer thickness. The total compensation potential may thus be related to the absolute amount of basic groups per unit area of the substrate.

The condensable group(s) of the compound may react via condensation reaction with the surface groups of the surface 11 of the substrate 10. In this respect, the method 1 further comprises grafting 3 a layer of the compound to the surface 11 via this condensation reaction.

Numerous suitable compounds are known which have one or more of such a condensable group and the above-described basic group. Compounds are known, for example, which comprise a linker moiety which links the condensable group(s) with the basic group. The linker moiety may comprise or consist of, for example, an alkyl or ether chain. The alkyl or ether chain may have, for instance, 2 to 20 carbon atoms.

The condensable group may, for example, comprise an alkoxy silyl group. In such an example, the compound is grafted to the surface via oxygen-silicon bonds. Other suitable condensable groups may alternatively or additionally be considered, provided that condensation reaction leads to the compound, together with the basic group, being grafted to the surface 11 of the substrate 10.

When the condensable group comprises an alkoxy silyl group, the compound may, for example, comprise two or preferably three alkoxy groups bonded to the same silicon of the alkoxy silyl group. In this example, the compound may be grafted to the surface 11 of the substrate 10 via a silicon atom which may also be subsequently grafted, via a further condensation reaction, to the polycondensable imprinting composition, as will be described in further detail herein below.

When the condensable group comprises such an alkoxy silyl group, the grafted layer may be regarded as an organically modified silicon oxide layer. Grafting such a layer to the surface 11 of the substrate 10 may be implemented wet chemically, as previously described. The resulting silicon oxide-type layer may form strong chemical bonds to the surface groups, e.g. the surface hydroxyl groups. The grafted layer may be chemically porous, e.g. water permeable, and therefore the final effect on the pH in the polycondensable imprinting composition layer may be a sum of the passivated acid generating surface hydroxyl groups and the basic groups from the grafted layer.

The compound may be defined generally by X—Y—Z, where X is the basic group, for example an amine; Y is the linker moiety, for example an alkyl chain, with or without an ether group in the chain, having 2 to 20 carbon atoms; and Z is the condensable group, for example an alkoxysilyl group, such as an alkoxysilyl group comprising two or preferably three alkoxy groups bonded to the same silicon atom.

A relatively simple example of the compound is 3-Aminopropyltriethoxysilane (APTES), which has one basic —$NH_2$ group per silicon atom. In the case of APTES, the basic group, X, is —$NH_2$, the linker moiety, Y, is —$CH_2CH_2CH_2$—, i.e. a $C_3$ alkyl chain, and the condensable group, Z, is —$Si(OEt)_3$.

More generally, the compound may comprise or consist of one or more selected from 3-Aminopropyltrimethoxysilane, 3-Aminopropyltriethoxysilane (APTES), N-Methyl-3-(trimethoxysilyl)propylamine, N-Methyl-3-(triethoxysilyl)propylamine, N-[3-(Trimethoxysilyl)propyl]butan-1-amine, N-[3-(Triethoxysilyl)propyl]butan-1-amine, [3-(6-Aminohexylamino)propyl]trimethoxysilane, [3-(6-Aminohexylamino)propyl]triethoxysilane, N-(2-Aminoethyl)-3-aminopropyltrimethoxysilane, N-(2-Aminoethyl)-3-aminopropyltriethoxysilane, N,N-Dimethyl-3-(trimethoxysilyl)propylamine, N,N-Dimethyl-3-(triethoxysilyl)propylamine, N,N-Diethyl-3-(trimethoxysilyl)propylamine, N,N-Diethyl-3-(triethoxysilyl)propylamine, Bis[3-(trimethoxysilyl)propyl]

amine, Bis[3-(triethoxysilyl)propyl]amine, 5,5'-Bis(triisopropoxysilyl)-2,2'-bipyridine, 5,5'-Bis(trimethoxysilyl)-2,2'-bipyridine, 5,5'-Bis(triethoxysilyl)-2,2'-bipyridine, N,N-Bis[(diphenylphosphino)methyl]-3-(trimethoxysilyl)propylamine, N,N-Bis[(diphenylphosphino)methyl]-3-(triethoxysilyl)propylamine, N-[3-(Trimethoxysilyl)propyl]aniline, and N-[3-(Triethoxysilyl)propyl]aniline.

FIG. 2A shows a two-stage grafting process. In 3A, the compound is applied as a layer 15A to the surface 11 of the substrate 10. In 3B, the condensable groups are reacted with the groups on surface 11, thereby to graft the layer of the compound 15B to the surface 11. The grafted layer 15B is distinguished in FIG. 2A from the applied layer 15A which is not yet grafted to the surface 11 by the hatching in the former but not the latter.

The condensable groups in the grafted layer 15B may, for example, react with each other to some degree, thereby providing a crosslinked grafted layer 15B of the compound.

The layer 15A of the compound may be applied 3A to the surface 11 of the substrate 10 in any suitable manner. The layer 15A may, for example, be applied 3A to the surface 11 as a neat liquid, for example by spin coating, inkjetting, spraycoating, etc., onto the surface 11.

Alternatively, the compound may be dissolved or dispersed in a suitable solvent, and applied 3A, for example by spin coating, inkjetting, spraycoating, etc., the solution or dispersion of the compound onto the surface 11. In such an example, the solvent may be evaporated during and/or subsequently to the applying 3A.

In other examples, and depending on the boiling point and vapour pressure of the compound, the compound may be applied 3A to the surface 11 via vapour deposition of the compound.

In a non-limiting example, the surface 11 of the substrate 10 may be freshly cleaned and activated, and placed in a desiccator. An amount, for example a few drops, of the compound having a suitably low boiling point/high vapour pressure, e.g. APTES, may be placed within the same volume, and the pressure may be lowered to below ~0.1 mBar for over 1 hour at room temperature. Following venting, the surface 11 may have a monolayer, or a semi-monolayer, of covalently bound compound, for example via surface —O—Si bonds in the case of APTES.

Whilst the applying 3A and grafting 3B stages are shown as distinguishable stages in FIG. 2A, the applying 3A and grafting 3B stages may, for example, be concurrent. In other words, the condensation reaction may occur while the layer 15A of the compound is being applied to the surface 11. Alternatively or additionally, the grafting 3B reaction may continue after application of the polycondensable imprinting composition onto the surface of the layer of the compound.

An elevated temperature, e.g. in the range of 30 to 100° C., may, for example, be used to assist the condensation reaction between the compound of the layer 15A and the surface groups, e.g. hydroxyl groups, on the surface 11. The basic group of the compound may assist to increase the pH of the grafted layer 15B, thereby to promote the condensation reaction.

The grafting 3 is, in certain examples, implemented at a temperature of less than 100° C. in order to control the rate of condensation, and thereby assist to improve the structural integrity of the grafted layer 15B, particularly when the grafted layer 15B is intended to have intralayer crosslinks between molecules of the compound.

In an embodiment, the grafted layer 15B has a thickness 16 of less than 10 nm, and preferably less than 5 nm. For example, the grafted layer 15B may have a thickness 16 between 1 nm and 5 nm. This 1 nm to 5 nm thickness 16 of the grafted layer 15B may assist in terms of providing proton binding sites to compensate for the acid generating groups of the substrate 10. Moreover, the basic groups of the grafted layer 15B may provide additional basic sites to increase the pH of the polycondensable imprinting layer, e.g. to achieve faster polycondensation/curing behaviour.

Moreover, such a relatively thin grafted layer 15B may assist to minimise the influence of the grafted layer 15B on the transfer of imprinted patterns to the imprinting layer atop the grafted layer 15B. Grafted layers 15B thicker than 10 nm may not provide additional advantages in terms of neutralising acidic sites on the surface 11 of the substrate 10, but rather may only lead to a disadvantage in that the residual (e.g. unpatterned) grafted layer 15B under the patterned layer is more pronounced.

The grafted layer 15B preferably is not patterned by the patterned stamp, but rather defines a non-imprinted subjacent layer with respect to the patterned layer. The grafted layer 15B may, for example, be defined by a monolayer or semi-monolayer of the compound. In other words, the grafted layer 15B may consist of a single layer of molecules of the compound grafted to the surface 11. Alternatively, the grafted layer 15B may be defined by two, three, or more layers of molecules of the compound grafted to the surface 11.

The thickness 16 may, for example, be determined from a high resolution scanning electron microscopy (SEM) or transmission electron microscopy (TEM) image of the substrate 10 and grafted layer 15B of the compound, optionally with the patterned layer atop the grafted layer 15B. In particular, high resolution SEM or TEM techniques may be used to identify the <10 nm thickness grafted layer 15B, and also identify the chemical composition of the grafted layer 15B, e.g. when such microscopy techniques are combined with energy-dispersive X-ray analysis. Optical methods such as ellipsometry can also be used to determine the thickness with single nm accuracy.

Such microscopy images may enable determination of the boundary between the substrate 10 and the grafted layer 15B, and, if applicable, the boundary between the grafted layer 15B and the imprinted layer. Several thicknesses 16 may be measured at intervals across the substrate 10. In such an example, the thickness 16 may correspond to the average of the measured thicknesses 16, where the number of measurements depends on the uniformity of thickness 16 of the grafted layer 15B, as will be readily appreciated by the skilled person.

The polycondensed material of the imprinted layer may have a different composition from that of the substrate 10 and the grafted layer 15B, such that the respective layers can be microscopically distinguished from each other. For example, after high temperature annealing during which organic groups may be removed, a density difference may be evident between the grafted layer 15B, e.g. an APTES grafted layer, and the patterned layer, e.g. the sol-gel or nanoparticle-derived patterned layer.

In the context of identifying the interface between the grafted layer 15B and the imprinted layer, the latter may be cured in a more controlled or slower manner in comparison to the grafting 3 of the compound to the surface 11 of the substrate 10, leading to the former having a different density and/or porosity compared to the latter. In a particular example, the polycondensed imprinted layer may have a higher density and a lower porosity than the grafted layer 15B. Thus, the interface between the grafted layer 15B and the imprinted layer may be readily microscopically distinguishable.

Referring to FIGS. 1, 2A, and 2B, the method 1 further comprises applying 4 a layer of a polycondensable imprinting composition 30 onto the grafted layer 15B, and imprinting 5 the imprinting composition layer 30 with a patterned stamp 20. Polycondensation of the imprinting composition 30 takes place during the imprinting thereby to form the patterned layer 50.

The grafted layer 15B is not visible in FIG. 2B for the sake of clarity, but it should be understood that the grafted layer 15B is grafted to the surface 11 of the substrate 10 throughout the steps depicted in FIG. 2B.

The polycondensable imprinting composition may be applied 4 in any suitable manner, e.g. by spincoating, inkjetting, spraycoating etc., although spin coating is specifically mentioned as a layer 30 of substantially uniform thickness 31, e.g. 20 nm to 1 μm, can be achieved in this manner. Additionally, ink-jet printing and subsequent imprinting yields uniform layers due to the capillary forces, e.g. due to surface tension of polar solvents after dispensing the droplets as well as underneath the stamp, causing redistribution of the imprinting composition to obtain a uniform thickness.

The polycondensable imprinting composition may, for example, comprise or consist of a sol. Polycondensation of the imprinting composition may, in such an example, involve gelation of the sol. In other words, polycondensation of the sol may result in formation of a gel. Thus, the sol may solidify to form the gel during the imprinting process. This solidification may cause the pattern 50 to remain in the layer of the imprinting composition 30 following release of the stamp 20 from the layer 30.

The sol may, for instance, be regarded as a colloid. The term "colloid" may refer to a solid-liquid and/or a liquid-liquid mixture in which solid or liquid particles are dispersed in a liquid medium.

In an embodiment, the polycondensable imprinting composition is a sol which comprises the hydrolysis product of at least one of a trialkoxysilane and a tetraalkoxysilane. For example, the sol may comprise the hydrolysis product of a trialkoxysilane and a tetraalkoxysilane. The sol-gel chemistry of such a system is shown in Reaction Scheme I, which is for illustrative purposes only. The various reactions shown in Reaction Scheme I are analogous to other sol-gel systems, such as those derived from titanium alkoxide, zirconium alkoxide or hafnium alkoxide precursors.

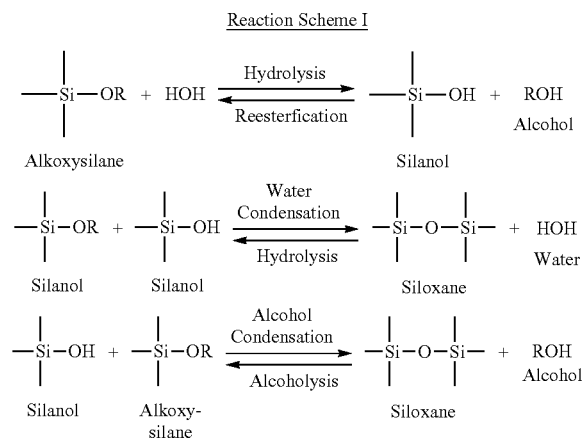

Reaction Scheme I

Sol-gel based resists tend to comprise small molecules or oligomers in solvents. The stability of the material is determined mainly by the solvents, water content and the pH level. This means that it is not possible to freely tune pH and solvents in the resist to achieve optimal conditions for fast curing once a thin layer of the resist is applied on a substrate 10.

In actual fact, the conditions for the polycondensable imprinting composition during storage may be diametrically different from those required during the imprinting 5. Polycondensation of the imprinting composition is desirably relatively slow when being stored, whereas the reactivity of the layer 30, e.g. relatively thin layer 30, of the polycondensable imprinting composition is desired to be higher in order to achieve fast curing and a high imprint throughput. Therefore, one would like to separate the functions and chemical environments: one system for application 4 on the substrate 10 and one for storage, e.g. in a bottle.

In the reaction to form a sol-gel system, alkoxysilanes may be used which undergo the reaction steps as shown in Reaction Scheme I in the presence of an acid or a base. Reaction Scheme I shows the acid-catalyzed reaction. The alkoxysilanes undergo a hydrolysis, which is followed by a condensation reaction between two hydrolyzed alkoxysilanes (water condensation reaction) or between a hydrolyzed alkoxysilane and an unreacted alkoxysilane (alcohol condensation reaction) in which the crosslinked inorganic network is formed. The degree of crosslinking may be controlled by appropriate choice of the alkoxysilanes, pH, reaction temperature, water ratio and co-solvents.

Alternatively or additionally, the sol may comprise the hydrolysis product of at least one of a titanium alkoxide, a zirconium alkoxide and a hafnium alkoxide. High quality patterned layers may be attained using such metal alkoxide-derived sol-gel systems, in relatively short imprinting times, particularly when the sol is applied 4 onto the grafted layer 15B.

More generally, the polycondensable imprinting composition may react with the condensable group of the compound, in other words the condensable groups of the grafted layer 15B, such as alkoxy and/or hydroxyl groups, which have not reacted with each other or with the surface groups of the substrate 10. Thus, the imprinted layer may itself become grafted to the layer 15B grafted to the surface 11 of the substrate 10. This may result in enhanced adhesion of the patterned layer 50 to the substrate 10.

In non-limiting examples in which the sol comprises the hydrolysis product of the trialkoxysilane and the tetraalkoxysilane, the molar ratio of the tetraalkoxysilane to the trialkoxysilane is preferably 1:1 to 0.45:0.55. It has been found that when a combination of an alkyl trialkoxysilane and a tetraalkoxysilane in the aforementioned ratio is used, a desirable degree of crosslinking in the gel may ultimately be attained. Preferably, the tetraalkoxysilane is selected from tetramethoxyorthosilicate and tetraethoxyorthosilicate, and the trialkoxysilane is selected from methyltrimethoxysilane and methyltriethoxysilane.

The sol may include a solvent which preferably is selected such that linear oligomers do not phase separate out of the sol, i.e. remain dissolved. The solvent may have a vapour pressure that is low enough to avoid significant evaporation of the solvent during application 4 of the imprinting composition layer 30 on the layer of the compound, as this can cause premature phase separation of the oligomers, which can deteriorate the quality of the structures formed by the imprinting process, e.g. because homogeneous deposition of the composition becomes problematic.

The sol may, for example, comprise an alcohol, preferably at least one of 1-propanol, 2-propanol, 1-butanol, 2-butanol, t-butanol and 1-methoxy-2-propanol.

Alternatively or additionally, the sol may comprise water, which may participate in hydrolysis during formation of the sol. The water may, for instance, be included in an amount of 5-20 mole per mole of metal/metalloid, e.g. silicon, in the composition. For example, the water may be included in the composition in an amount of 1 mole per mole of alkoxy group. It has been found that when the water content is selected within this range, particularly desirable oligomerization characteristics are obtained.

In order to obtain a measure of the pH of the polycondensable imprinting composition, e.g. the sol, a sample of the composition may be mixed with an equal volume of deionized water. In other words, the volume ratio of the sample of the composition to the deionized water is 1:1. The pH of the resulting mixture may be measured at normal temperature and pressure (NTP), i.e. 20° C. and 1 atm. A suitable calibrated pH probe may, for instance, be used for this purpose. Alternative reliable means of measuring the pH, e.g. pH titration, are known by the skilled person. The pH of the composition may, for example, be adjusted to 4-7 by using appropriate amounts of acid and/or base. The $pK_a$ of the acid and the $pK_a$ of the conjugate acid of the base may be taken into account for adjusting the pH, as will be readily appreciated by the skilled person.

By adjusting the pH of the sol such that the pH, as measured using this method, is 4-7 may result in the composition having appropriate properties, e.g. viscosity, for forming a layer of the composition which is suitable for imprinting. This pH has also been found to extend the shelf-life of the composition, e.g. relative to a composition having a pH, as measured using this method, which is greater than 7.

This pH may result in the condensation reactions being controlled such that the linear oligomers are present in the sol. The linear oligomers may, for instance, have a polymerization degree of 2-20.

Preferably, the sol has a pH of 4-6, such as 4.5-5.5, when mixed with an equal volume of deionized water and measured at 20° C. and 1 atm. The extent of network formation may be lower when the sol has a pH of 6-7, as measured using the abovementioned method, such that dewetting of an initially formed layer of the composition on a substrate surface may occur, and the final crosslinking during imprinting may take longer, e.g. relative to a composition having a pH of 4-6 or 4.5-5.5, as measured using the abovementioned method.

The pH range of 4-7 may have advantages in terms of the shelf-life of the sol, and its applicability to a surface, in this case the surface of the layer of the compound, e.g. the grafted layer 15B, so as to form a dense patterned layer.

Further lowering of the pH of the composition, in particular due to the presence of acidic sites on the surface 11 of the substrate 10 may, however, disadvantageously retard polycondensation of the imprinting composition. Such an effect has been found to make patterned layer formation prohibitively slow for certain substrates 10, such as aluminium and chromium substrates 10, whose oxide surface layers have such acidic sites.

The basic groups of the layer of the compound, e.g. the grafted layer 15B, may, however, assist in controlling the polycondensation of the layer of the imprinting composition 30. The basic groups may assist to neutralise acidic sites on the surface 11 of the substrate 10. Neutralisation of the acidic sites via the grafted layer 15B may thus enable an imprinted layer 50 to be formed within a shorter imprinting time than, for example, the scenario in which there is no layer of the compound, e.g. grafted layer 15B, on the surface 11 of the substrate 10 prior to the polycondensable imprinting composition layer 30 being applied 4 thereto.

The present method 1 may thus allow a higher throughput in automated nanoimprint tooling, such as the AutoSCIL™ volume production series machines from Philips SCIL Nanoimprint Solutions.

Different requirements concerning the chemistry and stability of the polycondensable imprinting composition may apply prior to application 4 as compared to during imprinting 5. Basic conditions may be desirable during imprinting 5, when formation of the three-dimensional network, i.e. gel, is required. In a non-limiting example, the sol comprises both a protic acid and a proton-accepting base. In this example, the reversible reaction product of the protic acid and the proton-accepting base defines an additive. The sol has a pH of 4-7 when mixed with an equal volume of deionized water and measured at 20° C. and 1 atm. This may mean that the acid and the base are in equilibrium with the salt of the acid and the base. The additive may thus be considered as an equilibrium mixture of the acid, the base, and the salt of the acid and the base. In other words, the additive for promoting gelation of the composition during imprinting 5 may be regarded as the reversible reaction product of the acid and the base. The vapour pressure of the acid is higher than that of the base at the imprinting temperature, e.g. between 15° C. to 120° C., so as to permit the acid to evaporate and the base to basify the layer during imprinting 5.

Thus, the higher vapour pressure of the acid relative to that of the base at the imprinting temperature, e.g. 15° C. to 120° C., means that the concentration of the base in the composition increases relative to the concentration of the acid in the composition during imprinting 5, which permits basification of the layer during imprinting 5. The basification, i.e. the pH increasing above 7, of the layer favours three-dimensional network formation. The time required for imprinting 5, i.e. the time required for sufficient gelation and hardening such that the stamp can be removed, is correspondingly decreased, e.g. relative to a composition which does not include the base.

The base may, for instance, be a "weak base", indicating that the base does not fully dissociate in aqueous solution. The $pK_a$ of the conjugate acid of the base in aqueous solution may, for instance, range from 3 to 11 at 25° C. (Ionic strength=0). The base may, for instance, include, or consist of, an amine, since the $pK_a$ of the conjugate acid of an amine in aqueous solution may be in the abovementioned range.

The base may, for example, include triethanolamine. In certain examples, the base consists of triethanolamine. Triethanolamine has a relatively low vapour pressure (<1.3 Pa at 20° C.) at the imprinting temperature, i.e. between 15° C. and 120° C., which means that when it is employed with an acid, e.g. formic acid, having a higher vapour pressure than that of the base, the composition may be basified during imprinting 5, thereby decreasing the imprinting time, as previously described.

Amine bases, such as triethanolamine, may be suitable because of their compatibility with sol-gel compositions, and may not undergo phase separation from the composition during applying 4 and imprinting 5. Such bases may also have relatively low toxicity and a prolonged shelf-life. Importantly, amine bases, such as triethanolamine, may not degrade a PDMS stamp, and absorption of the base in the PDMS may be minimal, thereby assisting to basify the layer and decrease the imprinting time, as explained above. The base preferably does not contain Na, K, Li, Rb, Cs, Ca, Sr, Ba. This is to ensure that the patterned layer is compatible with complementary metal-oxide-semiconductor (CMOS) processes.

Alternatively or additionally, the base may include an alkoxysilyl-functionalised amine and the sol-gel composition comprises the condensation product of the alkoxysilyl-functionalised amine and the hydrolysis product of the silicon tetraalkoxide and/or the alkoxysilane described above. The alkoxysilyl-functionalised amine is preferably aminopropyltriethoxysilane (APTES). By incorporating the base in the polymeric structure in this manner, the vapour pressure of the base may be extremely low. Providing the vapour pressure of the acid, e.g. formic acid, is sufficiently high at the imprinting temperature, the composition may be basified during imprinting 5, thereby decreasing the imprinting time, as previously described.

The acid may, for instance, be a "weak acid", indicating that the acid does not fully dissociate in aqueous solution. In other words, the acid is not completely, i.e. irreversibly, deprotonated. The $pK_a$ of the acid in aqueous solution may, for instance, range from 2 to 10 at 25° C. (Ionic strength=0).

The acid and the base are selected such that they react reversibly at the imprinting temperature. This involves consideration of the pKa of the acid and the pKa of the conjugate acid of the base, i.e. the respective equilibrium constants corresponding to the proton donation of the acid and the proton acceptance by the base, as will be immediately apparent to the skilled person.

The vapour pressure of the acid is higher than that of the base at the imprinting temperature. The values for the respective vapour pressures of the acid and the base per se may be different when the acid and the base are in the presence of other components, in this case the other components of the sol-gel composition. However, ensuring that the vapour pressure of the acid per se is higher than that of the base per se may ensure that the acid vapour pressure is also higher than the base vapour pressure in the composition. For example, the vapour pressure of the acid per se may be greater than 300 Pa at 20° C., and the vapour pressure of the base per se may be less than 10 Pa at 20° C.

ASTM E1194-17 describes procedures for measuring the vapour pressure of pure liquid or solid compounds. No single technique is able to measure vapour pressures from $1 \times 10^{-11}$ to 100 kPa (approximately $10^{-10}$ to 760 torr). The subject of ASTM E1194-17 is gas saturation which is capable of measuring vapour pressures from $1 \times 10^{-11}$ to 1 kPa (approximately $10^{-10}$ to 10 torr). Other methods, such as isoteniscope and differential scanning calorimetry (DSC) are suitable for measuring vapour pressures above 0.1 kPa. An isoteniscope (standard) procedure for measuring vapour pressures of liquids from $1 \times 10^{-1}$ to 100 kPa (approximately 1 to 760 torr) is available in Test Method D2879. A DSC (standard) procedure for measuring vapour pressures from $2 \times 10^{-1}$ to 100 kPa (approximately 1 to 760 torr) is available in Test Method E1782.

The percentage difference in the respective vapour pressures of the acid and the base, i.e. (the vapour pressure of the acid (per se)–the vapour pressure of the base (per se)/vapour pressure of the acid (per se))*100, may be at least 50%, such as greater than 70%, e.g. greater than 90%.

The acid may include at least one of a compound represented by Formula 1 and a compound represented by Formula 2;

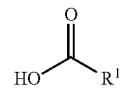

Formula 1 wherein $R^1$ is hydrogen, methyl or propyl;

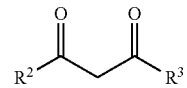

Formula 2 wherein $R^2$ and $R^3$ are individually selected from hydrogen and $C_1$-$C_3$ alkyl.

Regarding the compound represented by Formula 1, this compound may react reversibly with base to form a salt such that, at the imprinting temperature, the equilibrium may be driven to the side of the acid and the base by evaporation of the acid from the composition. In this respect, the vapour pressure of formic acid, $R^1$=H, is 4600 Pa at 20° C.; the vapour pressure of acetic acid, $R^1$=Me, is 1500 Pa at 20° C.; and the vapour pressure of propionic acid, $R^1$=Et is 390 Pa at 20° C. The relatively high vapour pressure of these compounds at the imprinting temperature, i.e. between 15° C. and 120° C., may assist their evaporation during imprinting 5. Providing the vapour pressure of the base is sufficiently low at the imprinting temperature, the composition may be basified during imprinting, thereby decreasing the imprinting time, as previously described.

Similar considerations apply to the compound represented by Formula 2. The carbon between the two carbonyl carbons bears an acidic proton. For example, the pKa of acetylacetone, $R^2$=$R^3$=Me, in aqueous solution is ca. 9 at 25° C. (Ionic strength=0), and the vapour pressure of acetylacetone is 920 Pa at 20° C.

In a preferred embodiment, the polycondensable imprinting composition comprises the reaction product of tetramethoxyorthosilicate (TMOS) and methyltrimethoxysilane (MTMS) in a water-alcohol mixture. The acid is preferably one or more of formic acid, acetic acid and propionic acid, and the base is an amine base, in particular triethanolamine (TEA) and/or aminopropyltriethoxysilane (APTES).

In a non-limiting example, the components included in the polycondensable imprinting composition prior to layering the composition onto the layer of the compound are selected from the ranges as specified in Table I. In Table I, where reference is made to weight percentages (wt. %), this is relative to the total weight of the polycondensable imprinting composition unless otherwise specified.

TABLE I

| Compound | Concentration Range |
|---|---|
| Monomeric sol-gel precursors, e.g. the trialkoxysilane and the tetraalkoxysilane | 1-20 wt. %; e.g. 5 wt. % solids, based of fully condensed trialkoxysilane and the tetraalkoxysilane |
| Water | 2-40 wt. %, e.g. 5-12 mole per mole of Si, in the polycondensable composition when the sol-gel precursors are the trialkoxysilane and the tetraalkoxysilane; e.g. 0.1-0.5 mole per mole of Zr or Hf when the sol-gel precursor is zirconium tetralkoxide or hafnium tetraalkoxide |
| Alcohol, e.g. a mixture of 1-propanol and 1-butanol | 15-98 wt. % |

TABLE I-continued

| Compound | Concentration Range |
| --- | --- |
| Protic acid, e.g. formic acid and/or acetic acid | 0.001-0.1 wt. % (depending on the pKa of the acid - the amount of the acid and the base should set the pH of the composition to around 4-7, e.g. 4-6 or 4.5-5.5) |
| Proton-accepting base, e.g. TEA and/or APTES | 0.001-0.1 wt. % (depending on the pKa of the conjugate acid of the base - the amount of acid and the base should set the pH of the composition to around 4-7, e.g. 4-6 or 4.5-5.5) |

The sol-gel precursors, protic acid, water, and solvents may be combined in order to effect acid hydrolysis. The base may be subsequently added to the hydrolysed mixture.

The polycondensable imprinting composition may, for example, be supplied as a kit, wherein the kit comprises a first component which includes the acid and the sol; and a second component which includes the base. As described above, acidic conditions are beneficial in terms of the shelf-life of the sol. The first component of the kit comprises the acid and the sol, and thus may have a shelf-life which permits, for instance, storage and transportation of the kit. Prior to use in an imprinting method, the first component may be combined with the second component which includes the base, thereby affording the sol-gel imprinting composition.

As an alternative to the sol-gel-based imprinting composition described above, the polycondensable imprinting composition may comprise a nanoparticle dispersion as the polycondensable content of the composition. The nanoparticles may be, for example, transition metal oxide particles. The nanoparticles may comprise polycondensable surface groups. Such polycondensable surface groups may permit the nanoparticles to react with each other via polycondensation, thereby enabling the polycondensable imprinting composition to solidify during the imprinting 5. It is nonetheless reiterated that in other examples, such nanoparticles are included in the above-described sol-gel-based imprinting composition.

In certain examples, some of the polycondensable surface groups may react with the condensable group of the compound, in other words the condensable groups of the grafted layer 15B which have not reacted with each other or with the surface groups. Thus, the imprinted layer 50 may itself become grafted to the layer 15B grafted to the surface 11 of the substrate 10.

In a non-limiting example, at least 80%, such as 85%, 90% or 95% of the polycondensable imprinting composition consists of nanoparticles.

Suitable nanoparticles include $TiO_2$, $ZrO_2$, $HfO_2$, $Ta_2O_3$, $V_2O_3$, $Nb_2O_3$, $Nb_2O_5$, $Y_2O_3$, $Fe_2O_3$, $BaTiO_3$ and $SrTiO_3$ nanoparticles, with anatase and rutile $TiO_2$ nanoparticles being particularly suitable. Rutile $TiO_2$ nanoparticles are particularly preferred because particularly high refractive index imprinted patterned layers may be formed from such nanoparticles but each of the other example transition metal oxide nanoparticles may be contemplated.

The nanoparticles may have a particle size distribution from a lower value ranging from 1-10 nm to an upper value ranging from 20-40 nm. For example, the lower value of the particle size distribution range may be 1, 2, 3, 4, 5, 6, 7, 8, 9 or 10 nm and the upper value of the particle size distribution range may be 20, 21, 22, 23, 24, 25, 26, 27, 28, 29, 30, 31, 32, 33, 34, 35, 36, 37, 38, 39 or 40 nm. Any combination of the specified lower and upper range values may be made to provide a particle size distribution falling under the scope of this embodiment. In a particularly preferred embodiment, the particle size distribution range is 5-15 or 15-30 nm. For the avoidance of doubt, where reference is made to a particle size, this includes spherical particles in which the particle size is the diameter of the particle as well as non-circle particles in which the largest cross-section of the particle is its particle size. Moreover, where reference is made to a size distribution, this means that at least 80% and preferably at least 90% of the nanoparticles have a size within the given size distribution. In other words, each size distribution may contain a small amount of outliers and where reference is made to a size distribution it is to be understood that not every single nanoparticle necessarily falls within the given size distribution.

Having transition metal oxide nanoparticles of different sizes within a particular particle size distribution has the advantage that a particularly good or dense packing of nanoparticles is obtained in the layer formed from the imprinting composition comprising such nanoparticles, as smaller particles can fill the voids in between the larger particles in such a distribution. If larger nanoparticles, e.g. nanoparticles larger than 40 nm, are being used, the integrity of the layer formed from the imprinting composition may deteriorate, leading to ill-defined patterns. This may equally be the case when transition metal oxide nanoparticles of different sizes in a size distribution range having a lower value in excess of 40 nm, e.g. a particle size distribution range of 50-70 nm, is used.

Nanoparticle stability is mainly tuned by charge, for example by relatively alkaline or acidic pH and/or by selection of the ligands on the surface of the nanoparticles. Similarly to the above-described sol-gel-based imprinting composition, it may not be possible to freely tune the pH and solvents in the resist in order to optimise conditions for fast curing once the layer of the polycondensable imprinting composition is applied on the surface 11 of the substrate 10.

The pH of the nanoparticle dispersion is preferably acidic, more preferably below 3 to reduce the risk of premature polymerization of the nanoparticles, e.g. the transition metal oxide nanoparticles. In examples where a polysiloxane matrix precursor is also present, the pH has the additional advantage of shifting the equilibrium of the polycondensation reactions from which such a matrix is formed towards the monomeric side of such reactions. Depending on the starting pH of the imprinting composition, this may be achieved by addition of a suitable acid or base to the dispersion. Non-limiting examples of other suitable acids include formic acid, acetic acid and propionic acid. Suitable bases include ammonia, methylamine, ethylamine, ethanolamine, diethanolamine (DEA), and triethanolamine (TEA).

DEA and TEA are particularly suitable as they exhibit a high boiling point, which would permit the formation of a stable acidic sol system that increases in pH during coating and evaporation of the solvents, where the low vapor pressure of DEA or TEA would cause these amines to be concentrated in the layer and increase the pH with ongoing evaporation of the solvents.

The nanoparticle dispersion may be formed using a stock solution of polymer matrix precursors. In order to suppress premature polycondensation of these precursors, such a stock solution may be kept at a low pH, for example a pH less than 1. Such acidic imprinting compositions may not be compatible with certain type of substrates, e.g. GaAs, InP, substrates, and may reduce the lifetime of the patterned stamps used to create the patterned layers from the imprinting compositions, e.g. PDMS stamps.

The nanoparticle dispersion may thus further comprise ammonia to increase the pH of the composition to a range of 1-3 to increase compatibility of the imprinting composition with the layer of the compound, e.g. the grafted layer 15B, and/or the substrate 10. To this end, a 1.0-2.0 wt % ammonia solution may be included in the dispersion, in other words in the polycondensable imprinting composition in the context of this example, in a range of 10-40% by weight by based on the total weight of the dispersion.

Where ammonia or other suitable base, is added to the imprinting composition, it is preferred that a polymerization inhibitor, such as 1,2-propanediol and 2-(2-ethoxyethoxy) ethanol, is also included. As explained above, ammonia may be replaced by any other suitable base, most notably DEA or TEA. The polymerization inhibitors are preferably included in a concentration of at least 0.07 wt. % based on the total weight of the imprinting composition. For example, the nanoparticle dispersion is in a range of 0.7-7.0% by weight, more preferably 5.0-7.0% by weight based on the total weight of the imprinting composition.

More generally, when the nanoparticle dispersion defines the polycondensable content of the polycondensable imprinting composition, the pH of the composition may be less than 3 when mixed with an equal volume of deionized water and measured at 20° C. and 1 atm.

In the case of the polycondensable imprinting composition being defined by the above-described nanoparticle dispersion, the neutralisation of the acidic sites on the surface 11 of the substrate 10 by the basic groups of the layer of the compound, e.g. the grafted layer 15B, may assist to avoid suppression or retarding of polycondensation of the nanoparticle dispersion which may otherwise occur if, for example, the dispersion were to be applied directly to the surface 11 of the substrate 10, i.e. without the layer of the compound, e.g. the grafted layer 15B, being first provided on the surface 11 of the substrate 10.

As shown in step 5A of FIG. 2B, an elastomeric stamp 20 having a major surface carrying a pattern 22 is imprinted 5 into the layer 30 of the polycondensable imprinting composition, thereby transferring the pattern 22 into this layer 30, as shown in step 5B. The features of the pattern 22 typically have μm or nm dimensions, i.e. widths and heights of such dimensions. For example, the feature dimensions may range from 5 nm to 500 nm.

The applied polycondensable imprinting composition layer 30 may, for example, take the form of a relatively viscous liquid due to some of the solvent of the composition, but not all, having evaporated prior to the imprinting 5 step.

The flexible stamp layer 22 may, for example, be brought into contact with the relatively viscous liquid by draping it, in a wave like fashion, starting at one side of the surface of the polycondensable imprinting layer 30 to the other side across its entire area. Capilliary forces between the flexible stamp layer 22 and the layer 30 may assist to pull the stamp layer 22 in at the contact front, thereby to cause the contact front to advance across the area of the surface of the layer 30 until the entire stamp layer 22 has been pulled into the surface of the layer 30. Air may thus be removed from between the stamp layer 22 and the polycondensable imprinting composition layer 30, and all of the relief of the stamp layer 22 may be filled with the imprinting composition.

The pattern 22 may be formed in any suitable manner, for example by creating at least the patterned surface of the elastomeric stamp 22 in a master mould as is well-known per se. The elastomeric stamp 20 preferably is permeable such that targeted constituents of the imprinting composition can diffuse into the stamp material and may be made of any suitable elastomeric material, e.g. a polysiloxane such as PDMS or another rubber-like stamp material having a low Young's modulus or having a suitably high permeability for water, alcohols and solvents, such as PFPE (Acryloxy Perfluoropolyether).

A suitable Young's modulus for example lies within the range of 2-100 MPa. For the avoidance of doubt it is noted that the reported Young's moduli have been determined by a standardized hardness test according to the ASTM D1415-06(2012) standard by penetrating the rubber material with a rigid ball under the conditions mandated by the standard.

The elastomeric stamp 20 may be made from a bulk material or may be built up in layers of varying Young's modulus.

Next, as depicted in step 5C, the imprinted layer 30 of the polycondensable imprinting composition undergoes polycondensation, in other words is cured, which optionally may comprise the application of a stimulus such as heat and/or UV radiation.

In an embodiment, the imprinting temperature is 15° C. to 120° C., such as 20° C. to 60° C. Preferably, the imprinting temperature is 20° C. to 55° C., more preferentially the imprinting process is performed isothermally between 18° C. and 25° C.

Upon completion of the polycondensation reaction, the elastomeric stamp 20 may be released from this layer in step 6, leaving behind the patterned layer 50 on the substrate 10, which retains its shape due to the network formed by the polycondensation reaction.

In an embodiment, the surface of the layer of the compound, e.g. the grafted layer 15B, on which the polycondensable imprinting layer 30 is applied may have surface groups reactive with the polycondensable imprinting composition by a further condensation reaction. The applying 4 and/or the imprinting 5 may thus further comprise grafting the polycondensable imprinting composition layer 30 to the grafted layer 15B via the further condensation reaction. This may facilitate adhesion of the patterned layer 50 to the substrate 10 via the grafted layer 15B.

FIG. 2B further schematically depicts the optional step of heating 7 the patterned layer 50 after removing the patterned stamp 20. This heating step 7 may, for example, be implemented at a temperature between 70° C. and 400° C. This additional heating step may implement further hardening and/or densifying of the patterned layer 50 during which further polycondensation reactions may occur and/or volatile components, e.g. alcohol(s) and water, may be evaporated from the patterned layer 50.

Next, an embodiment of a method 1 of forming a patterned layer using the compound and the polycondensable imprinting composition according to one or more embodiments described above will be explained with the aid of FIGS. 3 and 4, which schematically depict such a method 1.

Figure 3:
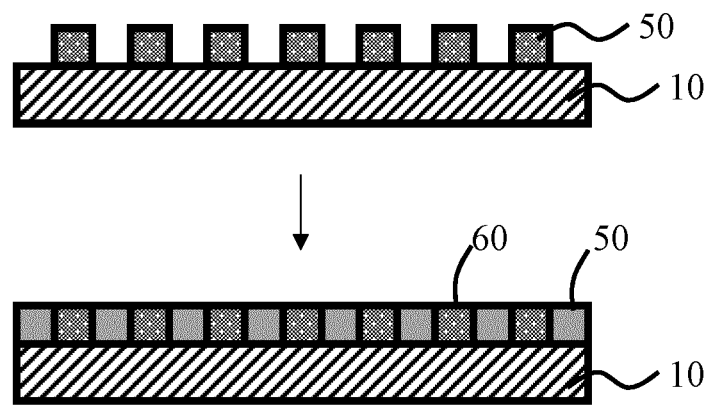
FIG. 3 schematically depicts part of a method of forming an imprinted layer according to another example.
Figure 4:
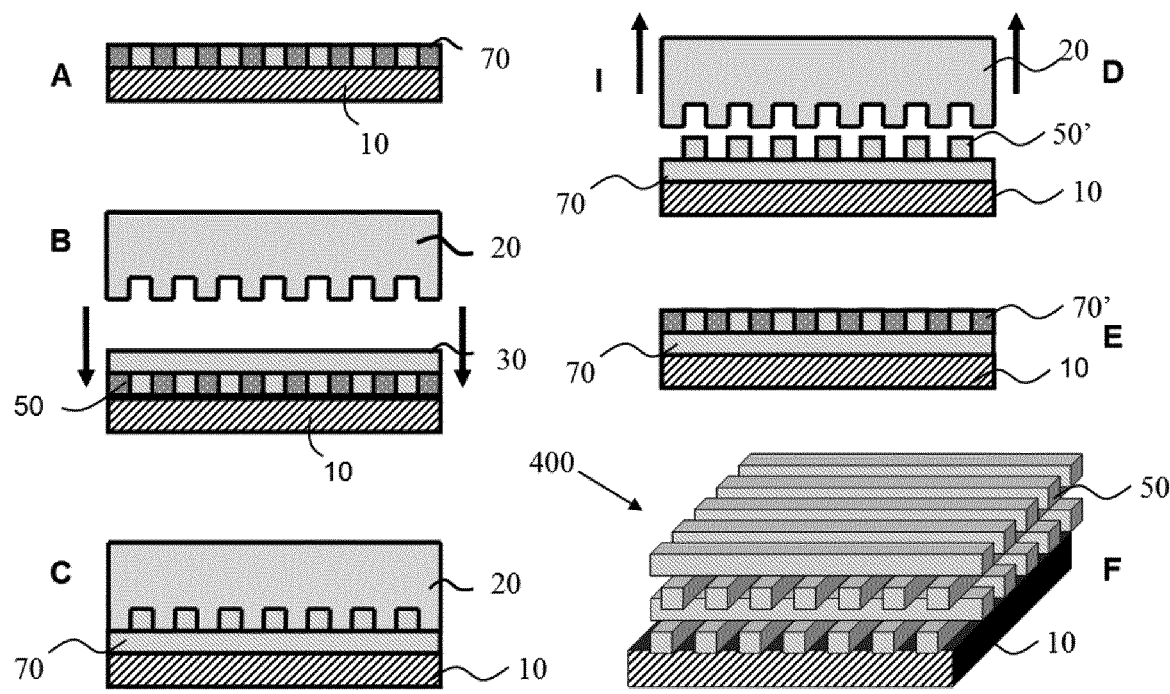
FIG. 4 schematically depicts part of a method of forming an imprinted layer according to a further example.

The method as schematically depicted in FIGS. 3 and 4 may be used to form three-dimensional structures built up from patterned layers 50. Such three-dimensional structures may be produced by filling or planarizing the patterned layer 50 by depositing a sacrificial planarization material 60 over the patterned layer 60, as shown in FIG. 3, and removing excess material if necessary, e.g. by etching or polishing. The sacrificial planarization material 60 preferably is a thermally degradable material, and may be any suitable thermally degradable material such as a thermally degradable polymer (TDP). A non-limiting example of a TDP is polynorbornene or polystyrene. Alternatively, the sacrificial planarization material 60 may be soluble in a particular solvent. In general, any sacrificial planarization material 60 that can be selectively removed from a formed multi-layer structure without damaging the patterned layers 50 formed from the polycondensable imprinting composition 30.

A non-limiting example of a method 1 of manufacturing such a three-dimensional structure is shown in FIG. 4. In step A, a planarized layer 70 is formed on the grafted layer 15B (not visible in FIGS. 3 and 4) on the surface of a substrate or carrier 10, as previously explained. The patterned layer portion 50 of the planarized layer 30 may be produced by imprint lithography (Substrate Conformal Imprint Lithography, SCIL) using the polycondensable imprinting composition in accordance with the method shown in FIGS. 2A and 2B. The patterned layer 50 is filled, i.e. planarized with a sacrificial filling material 60 as previously explained with the aid of FIG. 3. In step B, a next layer of the curable imprinting composition 30 according to an embodiment is applied over the planarized layer 70 of step A in any suitable manner, e.g. by spincoating, dispensing or doctor blading.

The polycondensable imprinting composition 30 deposited in step B is subsequently embossed by a suitably patterned elastomeric stamp 20 after alignment of the stamp with respect to the substrate 10, as shown in step C. In step C, the imprint orientation of the stamp 20 with the substrate 10 has been rotated 90° with respect to the imprint orientation used to form the first patterned layer 50. It will be appreciated that other orientation rotation angles are equally feasible.

The polycondensable imprinting composition layer 30 is subsequently solidified (densified), e.g. as shown in FIG. 3, to form a further patterned layer 50' as shown in step D. Obviously, the formation of the further patterned layer 50' may be completed after removal of the patterned elastomeric stamp 20, as previously discussed. Removing the patterned elastomeric stamp 20 leaves the further patterned layer 50' on the planarized layer 70 of step A. The newly formed patterned layer 50' may again be planarized as shown in step E to form a further planarized layer 70', after which additional layers may be formed by repeating the steps B-E. The height of the patterned portions of the patterned layers 50, 50' may be reduced using an additional processing step, e.g. by means of reactive ion etching.

The sacrificial planarizing material 60 may be removed afterwards by e.g. dissolving the sacrificial planarizing material 60 in a suitable solvent or by thermal decomposition, thus yielding an optical device 400 in the form of a stacked structure as shown in step F. The polycondensable imprinting composition is particularly suitable for application in this method because it can withstand most solvents required to dissolve the sacrificial planarizing material 60, as well as withstand high temperatures up to 600° C. or even 1000° C., thereby making it particularly suitable for use with sacrificial planarizing materials 60 in the form of thermally degradable compounds such as a TDP.

In any of the aforementioned embodiments may it be necessary to remove residual imprint structures from e.g. the substrate 10, for instance when a layer on the substrate 10 has been patterned using the imprint structures as a mask. The imprint structures may be removed by any suitable etching technique, e.g. reactive ion etching.

In an embodiment, the patterned layer 50 is included in an etch mask. In another embodiment, the patterned layer 50 is included in an optical element.

In a non-limiting example, the optical element is a light guide optically coupled to a number of solid state lighting elements, e.g. LEDs. The optical coupling may ensure that the light emitted by the solid state lighting elements is coupled into the light guide body and directed towards the patterned layer 50, with the patterned layer 50 causing the light travelling through the light guide body to be coupled out of the light guide body. The solid state lighting elements may be LEDs of any suitable colour or combination of colours, e.g. white LEDs, blue LEDs, green LEDs, and so on.

In another example, a lighting device is a projection device, and the patterned layer is arranged to concentrate (collimate) the light exiting the light guide body in order to generate a collimated light beam. This yields a particularly compact collimator compared to for instance compound parabolic concentrators that are commonly used for this purpose. The projection device may comprise a plurality of modules for generating a light beam of a primary colour, which light beams may be combined onto a projection lens to generate a colour image as is well-known per se. At least one of such modules may comprise the optical element in order to generate the collimated light beam. In an embodiment, the optical element is further configured as a wavelength conversion element, for instance to convert light from blue LEDs into green light (e.g. about 450 nm to about 500 nm conversion). The lighting device alternatively may form a light rod in which the optical element acts as a light guide and optionally further acts as a wavelength conversion element.

It should be understood that many other embodiments of an optical element are equally feasible. In another example embodiment, the optical element is optically coupled, e.g. in physical contact with, a solid state lighting chip or package, e.g. a LED chip or package, wherein the optical element is configured as a lens element or collimator to yield a lighting device such as a light bulb or the like.

In yet another example, the patterned layer may be included in a waveguide combiner system, for example a waveguide combiner system used for augmented reality, e.g. near to the eye applications.

The optical element may be integrated in other types of devices, e.g. other types of electronic devices. For example, the optical element may form part of an optical sensor in which the optical element for instance may be used as a light-harvesting layer of the optical sensor.

Alternatively, the optical element may form part of a photovoltaic device such as a solar cell or solar panel, which photovoltaic device typically comprises one or more photovoltaic cells for converting light into electricity. In such a device, the optical element, for instance, may be used as an in-coupling layer for the one or more photovoltaic cells, for example a patterned layer of a flat silicon substrate acting as a light trapping layer. Such light trapping layers are known per se, as for instance explained by Spinelli et al. in Applied Physics Letters, 102, 233902 (2013) and will therefore not be explained in further detail for the sake of brevity only.

It is reiterated that the optical element is not limited to the aforementioned embodiments; any embodiment in which an appropriately dimensioned patterned layer 50 may be used to interact with light in a predetermined manner may be considered. Examples of such optical elements include lenses, light scattering elements, collimators, in-coupling elements, waveguides, photonic devices such as ring resonators, wavelength filters, amplitude modifiers, and so on.

Inorganic crosslinking based imprint resists (sol-gel-based, nanoparticle dispersion-based) may have advantages over organic based imprint resist systems. These are stable to light and temperature, and provide the possibility for a low or high index of refraction of the patterned layer. Such inorganic imprint resists may further assist to prolong the lifetime of the patterned stamp 20. But, as described above, the disadvantage of such polycondensable imprinting compositions is that the (inorganic) polycondensation reactions are sensitive to the pH level. Certain substrate 10 materials, such as metal oxides or nitrides may behave as a Brønsted acid or base, thereby influencing the pH in the relatively thin resist layer 30. This effect can be so strong that curing times for one substrate type may be less than one minute while on another substrate type the same imprinting composition may take 6-15 hours to cure. This may be caused by the acidity of the surface influencing the crosslinking equilibrium. By applying a relatively thin, e.g. <5 nm, layer of the compound having basic groups, for example a sol-gel layer with basic groups, the pH level in the resist layer 30 can be set to the desired value or range for fast curing/imprinting. In this way, the substrate 10 is decoupled from the resist system itself, thereby allowing tuning of the material properties of the patterned layer 50.

The present invention will now be explained in more detail by way of the following non-limiting examples.

A commercially available sol-gel-based polycondensable imprinting composition was provided: NanoGlass T-1100 from SCIL Nanoimprint Solutions. This composition is a trimethyl orthosilicate (TMOS) and methyltrimethoxysilane (MTMS) aqueous sol (polymer/oligomer solution) comprising a mixture of 1-propanol and 1-butanol. The 1-butanol accounts for 20 wt. % of the imprinting composition, and the 1-propanol is a residual amount, e.g. <1 wt. % of the imprinting composition. A solid fraction (fully condensated material) accounts for 2.5 wt. % of the imprinting composition. The imprinting composition contains 0.25 wt. % APTES with respect to the solid fraction obtained from the TMOS and MTMS. The APTES is balanced with formic acid so that the imprinting composition has a pH of 5.5 (when mixed with 50/50 w/w DI water).

As shown in the first row of data in Table II below, the shelf life of this polycondensable imprinting composition is 24 hours at room temperature. However, the imprinting times on aluminium (3-15 minutes) and chromium substrates (5-10 minutes) are significantly longer than on silicon (~1 minute) and silicon nitride (<1 minute) substrates.

A layer of the compound, in this example APTES, was grafted to the aluminum and to the chromium substrates. The layer had a thickness of <5 nm, such that the APTES layer was a monolayer or a semi-monolayer.

The APTES is straightforward to apply in such a (semi-) monolayer by a vapour phase method. A freshly cleaned and activated substrate surface was placed in a desiccator and a few drops of APTES were placed in the same volume. This was pumped down to a pressure below ~0.1 mBar for over 1 hour at room temperature. After venting, the surface had a semi-monolayer of covalently bound APTES, grafted to the surface via the M-O—Si bonds (M=Si, Cr or Al). The —NH$_2$ group of the APTES provides the basic group, as previously described.

An alternative wet chemical method for applying the APTES was also tested. This involved spincoating a 0.1 wt % solution of APTES in 50/50 water/n-propanol until the solvent had evaporated. The applied layer was then baked at 70° C. for 1 minute. This method was found to result in formation of a strong chemically bound layer of less than 5 nm thick on Cr and Al respectively.

On the grafted APTES layer, the silica-sol-gel resist was then spincoated. As shown in Table II, an improved, faster curing behaviour (with a shorter curing time) was observed for the aluminum substrate with the grafted layer (~1 minute), and the chromium substrate (~1 minute) with the grafted layer. Thus, relatively fast curing of the polycondensable imprinting composition was observed for aluminium and chromium substrates in spite of the acidic sites on the respective surfaces of these substrates which retard the polycondensation in the absence of the grafted layer. This is thought to be at least partly due to the basic groups of the grafted layer neutralising the acidic sites on the aluminium and chromium substrates, such that these acidic sites exert less influence on the polycondensation of the imprinting composition.

TABLE II

| Polycondensable imprinting composition | Shelf life at room temperature | Imprint time on substrate type at 50° C.; No grafted layer on the substrate | | | | Imprint time on Al with <5 nm grafted layer | Imprint time on Cr with <5 nm grafted layer |
| --- | --- | --- | --- | --- | --- | --- | --- |
| | | Si | SiNx | Al | Cr | | |
| NanoGlass T-1100 | 24 hours | ~1 minute | <1 minute | 3-15 minutes | 5-10 minutes | ~1 minute | ~1 minute |
| NanoGlass T-1100 but without the formic acid; pH 8-8.5 | <2 hours | 0.3-0.5 minute | <0.5 minute | <2 minute | <2 minute | <0.1 minute | <0.1 minute |
| NanoGlass T-1100 but without the APTES and without the formic acid; pH 4-7 | ~2 weeks | 10-12 minutes | 3-5 minutes | 3-15 hours | >6 hours | ~1 minute | ~1 minute |

Table II also shows the effect of adding base to the polycondensable imprinting composition. The second row of data in the table relates to a composition which is the same as the NanoGlass T-1100 but has no formic acid to compensate for the basicity of the APTES, such that its pH is 8-8.5. The base (APTES in this example, but could also be, for instance, triethanolamine) causes the imprinting time to decrease but the shelf-life also to decrease (to <2 hours from 24 hours).

The third row of data in the table relates to a composition which is the same as the NanoGlass T-1100 but without APTES and without formic acid, such that its pH is 4-7. This composition had an increased shelf-life (~2 weeks) but also longer imprinting times (10 minutes to >6 hours depending on the substrate) when no layer of the compound (APTES)

was first applied to the surface of the substrate. Nevertheless, by the grafted APTES layer decoupling of the surface chemistry of the substrate from the chemistry, including pH, of the polycondensable imprinting composition, relatively short imprint times (~1 minute) were achieved while preserving the shelf life of the composition.

The patterned layers formed on the grafted layer, following removal of the stamp and heating at 150° C., were furthermore found to have improved adhesion to the substrate compared to when the imprinting composition was directly applied to the substrate without the grafted layer therebetween (and similarly annealed).

A tape adhesion test method was used to evaluate the adhesion of the patterned layer to the substrate. This test is designed to use pressure-sensitive tape to determine the adhesion quality of a coating.

Such a test is typically used to assess the adhesion of corrosion-resistant coatings to the surface on which they are applied. In order for corrosion-resistant coatings to perform properly, they must adhere to the surface on which they are applied, and the tape adhesion test can determine whether or not a coating is properly adhering to its substrate. ASTM D3359 is known as the Standard Test Method for the Measuring Adhesion by Tape Test. In a version of this method, scratches are made in the coating (hatched) before the tape is applied.

The patterned layers of the present examples were found to have excellent adhesion to the substrate. In these examples, 3M scotch magic tape was applied without air inclusions. Then the tape was pulled up and moved with the release front, such that the releasing tape is perpendicular to the surface. No removal of the patterned layer from the substrate and sticking to the tape was observed when the patterned layer was formed on the layer of the compound (APTES) between the patterned layer and the substrate.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method of providing a patterned layer, the method comprising: providing a substrate comprising a surface to which a layer of a compound is applied, the compound comprising: at least one condensable group reactive with surface groups of said surface by condensation reaction and a basic group for accepting protons, wherein the basic group comprises a Bronsted base group;
applying a layer of a polycondensable imprinting composition onto the layer of the compound; and
imprinting the imprinting composition layer with a patterned stamp, wherein polycondensation of the imprinting composition occurs during the imprinting providing said patterned layer
wherein the at least one condensable group comprises an alkoxy silyl group, the compound being thereby grafted to the surface via oxygen-silicon bonds; and
the condensable group comprises two or three alkoxy groups bonded to the same silicon of the alkoxy silyl group.

2. The method according to claim 1, wherein the substrate comprises:
a metal or metalloid layer; and
an oxide layer disposed on the metal or metalloid layer, wherein said surface groups comprise hydroxyl groups included in a surface of said oxide layer.

3. The method according to claim 1, wherein the providing comprises grafting a layer of the compound to the surface via said condensation reaction; optionally wherein said grafting comprises vapour deposition of the compound on the surface; or wherein said grafting comprises applying the compound to the surface as a liquid, the compound being applied as a neat liquid, or as a solution or dispersion in a solvent.

4. The method according to claim 1, wherein the basic group comprises an amine group.

5. The method according to claim 1, wherein: the compound comprises a linker moiety, the linker moiety linking the at least one condensable group with the basic group; and the linker moiety is an alkyl or ether chain, the alkyl or ether chain having 1 to 20 carbon atoms.

6. The method according to claim 1 wherein the compound is one or more selected from 3-Aminopropyltrimethoxysilane, 3-Aminopropyltriethoxysilane, N-Methyl-3-(trimethoxysilyl)propylamine, N-Methyl-3-(triethoxysilyl)propylamine, N-[3-(Trimethoxysilyl)propyl]butan-1-amine, N-[3-(Triethoxysilyl)propyl]butan-1-amine, [3-(6-Aminohexylamino)propyl]trimethoxysilane, [3-(6-Aminohexylamino)propyl]triethoxysilane, N-(2-Aminoethyl)-3-aminopropyltrimethoxysilane, N-(2-Aminoethyl)-3-aminopropyltriethoxysilane, N,N-Dimethyl-3-(trimethoxysilyl)propylamine, N,N-Dimethyl-3-(triethoxysilyl)propylamine, N,N-Diethyl-3-(trimethoxysilyl)propylamine, N,N-Diethyl-3-(triethoxysilyl)propylamine, Bis[3-(trimethoxysilyl)propyl]amine, Bis[3-(triethoxysilyl)propyl]amine, 5,5'-Bis(triisopropoxysilyl)-2,2'-bipyridine, 5,5'-Bis(trimethoxysilyl)-2,2'-bipyridine, 5,5'-Bis(triethoxysilyl)-2,2'-bipyridine, N,N-Bis[(diphenylphosphino)methyl]-3-(trimethoxysilyl)propylamine, N,N-Bis[(diphenylphosphino)methyl]-3-(triethoxysilyl)propylamine, N-[3-(Trimethoxysilyl)propyl]aniline, and N-[3-(Triethoxysilyl)propyl]aniline.

7. The method according to claim 1, wherein the layer of the compound has a thickness of less than 10 nm.

8. The method according to claim 1, wherein the layer of polycondensable imprinting composition comprises the hydrolysis product of at least one of a trialkoxysilane and a tetraalkoxysilane; optionally wherein the polycondensable imprinting composition layer comprises the hydrolysis product of the trialkoxysilane and the tetraalkoxysilane, and the molar ratio of the tetraalkoxysilane to the trialkoxysilane is 1:1 to 0.45:0.55.

9. The method according to claim 8, wherein, prior to said applying the layer of polycondensable imprinting composition onto the layer of the compound, the polycondensable imprinting composition has a pH of 4-7 when mixed with an equal volume of deionized water and measured at 20° C. and 1 atm.

10. The method according to claim 1, wherein the layer of polycondensable imprinting composition comprises nanoparticles; optionally wherein the nanoparticles are transition metal oxide nanoparticles comprising polycondensable surface groups.

11. The method according to claim 1, wherein the layer of the compound on which the layer of polycondensable imprinting composition is applied has a further surface comprising surface groups reactive with the polycondensable imprinting composition layer by a further condensation reaction, said applying and/or imprinting further comprising grafting the polycondensable imprinting composition layer to the further surface via said further condensation reaction.

12. The method according to claim 1, further comprising removing the patterned stamp after the imprinting, and optionally heating the patterned layer after removing the patterned stamp at a temperature between 70° C. and 400° C.

13. The method according to claim 1, comprising using a kit comprising a first component and a second component, the first and second components being supplied separately from each other in the kit, wherein the first component comprises the compound, and the second component comprises the polycondensable imprinting composition.

* * * * *